US008558485B2

(12) United States Patent
Antaya

(10) Patent No.: US 8,558,485 B2
(45) Date of Patent: Oct. 15, 2013

(54) COMPACT, COLD, SUPERCONDUCTING ISOCHRONOUS CYCLOTRON

(75) Inventor: Timothy A. Antaya, Hampton Falls, NH (US)

(73) Assignee: Ionetix Corporation, San Francisco, CA (US)

( * ) Notice: Subject to any disclaimer, the term of this patent is extended or adjusted under 35 U.S.C. 154(b) by 37 days.

(21) Appl. No.: 13/178,421

(22) Filed: Jul. 7, 2011

(65) Prior Publication Data

US 2013/0009571 A1 Jan. 10, 2013

(51) Int. Cl.
*H05H 13/00* (2006.01)
*H01L 39/02* (2006.01)

(52) U.S. Cl.
USPC ............ 315/502; 505/150; 315/500; 315/505

(58) Field of Classification Search
USPC .......................................................... 315/502
See application file for complete search history.

(56) References Cited

U.S. PATENT DOCUMENTS

| | | | | |
|---|---|---|---|---|
| 3,175,131 | A | 3/1965 | Burleigh et al. | |
| 3,868,522 | A | 2/1975 | Bigham et al. | |
| 3,925,676 | A | 12/1975 | Bigham et al. | |
| 6,057,655 | A | 5/2000 | Jongen | |
| 6,683,426 | B1 * | 1/2004 | Kleeven | 315/502 |
| 2007/0101742 | A1 * | 5/2007 | Laskaris et al. | 62/259.2 |
| 2009/0206967 | A1 * | 8/2009 | Antaya | 335/216 |

FOREIGN PATENT DOCUMENTS

WO WO 88007229 12/1986

OTHER PUBLICATIONS

Marti, et al., Modifications to the Injection System of the K800 Superconducting Cyclotron, Aug. 1983, IEEE Transactions on Nuclear Science, vol. NS-30, No. 4, p. 2105-2107.*

Friesel, et al., Medical Cyclotrons, Jun. 2009, Reviews of Accelerator Science and Technology, vol. 2, pp. 133-156.*

European Patent Office, International Search Report and Written Opinion for PCT/US2011/043483 (corresponding PCT application) (May 30, 2012)

Kubo, et al, "Design of a model sector magnet for the RIKEN superconductor ring cyclotron", PAC 1997 Vancouver, vol. 3, 3428-3430 (May 15, 1997).

Mitsumoto, et al,. "Desion study of sector magnet for the RIKEN superconducting ring cyclotron (I)", 5th European Particle Accelerator Conference, EPAC'96 (Jun. 11, 1996).

(Continued)

*Primary Examiner* — Jerome Jackson, Jr.
*Assistant Examiner* — David Lotter
(74) *Attorney, Agent, or Firm* — Modern Times Legal; Robert J. Sayre

(57) ABSTRACT

A compact, cold, superconducting isochronous cyclotron can include at least two superconducting coils on opposite sides of a median acceleration plane. A magnetic yoke surrounds the coils and a portion of a beam chamber in which ions are accelerated. A cryogenic refrigerator is thermally coupled both with the superconducting coils and with the magnetic yoke. The superconducting isochronous cyclotron also includes sector pole tips that provide strong focusing; the sector pole tips can have a spiral configuration and can be formed of a rare earth magnet. The sector pole tips can also be separated from the rest of the yoke by a non-magnetic material. In other embodiments, the sector pole tips can include a superconducting material. The spiral pole tips can also include cut-outs on a back side of the sector pole tips remote from the median acceleration plane.

21 Claims, 14 Drawing Sheets

(56) References Cited

OTHER PUBLICATIONS

Daniel, et al., "Design status of the Munich cyclotron SUSE", IEEE Transactions on Nuclear Science, vol. 28, No. 3, 2107-09 (Jun. 1981).

Bigham, C. B., "Magnetic trim rods for superconducting cyclotrons", Nuclear Instruments and Methods, North-Holland, vol. 131, No. 2, 223-228 (Dec. 24, 1975).

* cited by examiner

COMPACT, COLD, SUPERCONDUCTING ISOCHRONOUS CYCLOTRON

BACKGROUND

A cyclotron for accelerating ions (charged particles) in an outward spiral using an electric field impulse from a pair of electrodes and a magnet structure is disclosed in U.S. Pat. No. 1,948,384 (inventor: Ernest O. Lawrence, patent issued: 1934). Lawrence's accelerator design is now generally referred to as a "classical" cyclotron, wherein the electrodes provide a fixed acceleration frequency, and the magnetic field decreases with increasing radius, providing "weak focusing" for maintaining the vertical phase stability of the orbiting ions.

Among modern cyclotrons, one type is a class characterized as being "isochronous," wherein the acceleration frequency provided by the electrodes is fixed, as with classical cyclotrons, though the magnetic field increases with increasing radius to compensate for relativity; and an axial restoring force is applied during ion acceleration via an azimuthally varying magnetic field component derived from contoured iron pole pieces having a sector periodicity. Most isochronous cyclotrons use resistive magnet technology and operate at magnetic field levels from 1-3 Tesla. Some isochronous cyclotrons use superconducting magnet technology, in which superconducting coils magnetize warm iron poles that provide the guide and focusing fields for ion acceleration. These superconducting isochronous cyclotrons can operate at field levels below 3 Tesla for protons and up to 3-5 Tesla when designed for accelerating heavier ions. The present inventor worked on the first superconducting cyclotron project in the early 1980's at Michigan State University.

Another class of cyclotrons is the synchrocyclotron. Unlike classical cyclotrons or isochronous cyclotrons, the acceleration frequency in a synchrocyclotron decreases as the ion spirals outward. Also unlike isochronous cyclotrons—though like classical cyclotrons—the magnetic field in a synchrocyclotron decreases with increasing radius. Synchrocyclotrons have previously had warm iron poles and cold superconducting coils, like the existing superconducting isochronous cyclotrons, but maintain beam focusing during acceleration in a different manner that scales to higher fields and can accordingly operate with a field of, for example, about 9 Tesla.

SUMMARY

A compact, cold, superconducting isochronous cyclotron is described herein. Various embodiments of the apparatus and methods for its construction and use may include some or all of the elements, features and steps described below.

The compact, cold, superconducting isochronous cyclotron can include at least two superconducting coils on opposite sides of a median acceleration plane. A magnetic yoke surrounds the coils and contains a portion of a beam chamber in which ions are accelerated, and the median acceleration plane extends through the beam chamber. A cryogenic refrigerator is thermally coupled both with the superconducting coils and with the magnetic yoke; for example, the magnetic yoke can be in thermal contact with a thermal link from the cryogenic refrigerator and with the superconducting coils. The superconducting isochronous cyclotron can also include spiral pole tips that supply a sector-based or azimuthally varying magnetic field to provide strong focusing to maintain the vertical stability of the accelerating ion; the spiral pole tips can be formed of a rare earth magnet and can be magnetically floating (i.e., separated by non-magnetic compositions) from the rest of the yoke. In other embodiments the pole tips can include a superconductor. The pole tips can also include cutouts on a back side of the tips remote from the median acceleration plane to shape the profile of the resulting magnetic field.

During operation of the isochronous cyclotron, an ion is introduced into the median acceleration plane at an inner radius. Electric current from a radiofrequency voltage source is applied to a pair of electrode plates mounted on opposite sides of the median acceleration plane inside the magnetic yoke to accelerate the ion in an expanding orbit across the median acceleration plane. The superconducting coils are cooled by the cryogenic refrigerator to a temperature (e.g., 10 to 12K) no greater than the superconducting transition temperature of the superconducting coils, and the magnetic yoke is likewise cooled (e.g., to ≤50K). A voltage is supplied to the cooled superconducting coils to generate a superconducting current in the superconducting coils that produces a magnetic field that accelerates the ion in the median acceleration plane; and the accelerated ion is extracted from the beam chamber when it reaches an outer radius.

The entire magnet structure, including coils, poles, the return-path iron yoke, trim coils, superconducting magnets, shaped ferromagnetic pole surfaces, and fringe-field cancelling coils or materials can be mounted on a single simple thermal support, installed in a cryostat and held at or near the operating temperature of the superconducting coils. Because there is no gap between the yoke and the coils, there is no need for a separate mechanical support structure for the coils to mitigate the large decentering forces that are typically encountered at high field in existing superconducting cyclotrons; moreover, decentering forces can be substantially reduced or eliminated.

The cold magnet materials of the magnetic yoke can be used simultaneously to shape the field and to structurally support the superconducting coils, further reducing the complexity and increasing the intrinsic safety of the isochronous cyclotron. Moreover, with all of the magnet contained inside the cryostat, the external fringe field may be cancelled without adversely affecting the acceleration field, either by field-cancelling superconducting coils or by field-cancelling superconducting surfaces affixed to intermediate temperature shields within the cryostat.

The isochronous cyclotron designs, described herein, can offer a number of additional advantages both over existing superconducting isochronous cyclotrons and over existing superconducting synchrocyclotrons, which are already more compact and less expensive than conventional equivalents. For example, the magnet structure can be simplified because there is no need for separate support structures to maintain the force balance between constituents of the magnetic circuit, which can reduce overall cost, improve overall safety, and reduce the need for space and active protection systems to manage the external magnetic field. Additionally, the isochronous cyclotrons can operate with a low relativistic factor and can produce a high magnetic field (e.g., of 6 Tesla or above). Additionally, the apparatus does not need a complex variable-frequency acceleration system, since the design of these isochronous cyclotrons can operate on a fixed acceleration frequency. Accordingly, the isochronous cyclotrons of this disclosure can be used in mobile contexts and in smaller confines.

BRIEF DESCRIPTION OF THE DRAWINGS

In the accompanying drawings, like reference characters refer to the same or similar parts throughout the different views. The drawings are not necessarily to scale, emphasis instead being placed upon illustrating particular principles, discussed below.

DETAILED DESCRIPTION

Figure 1:
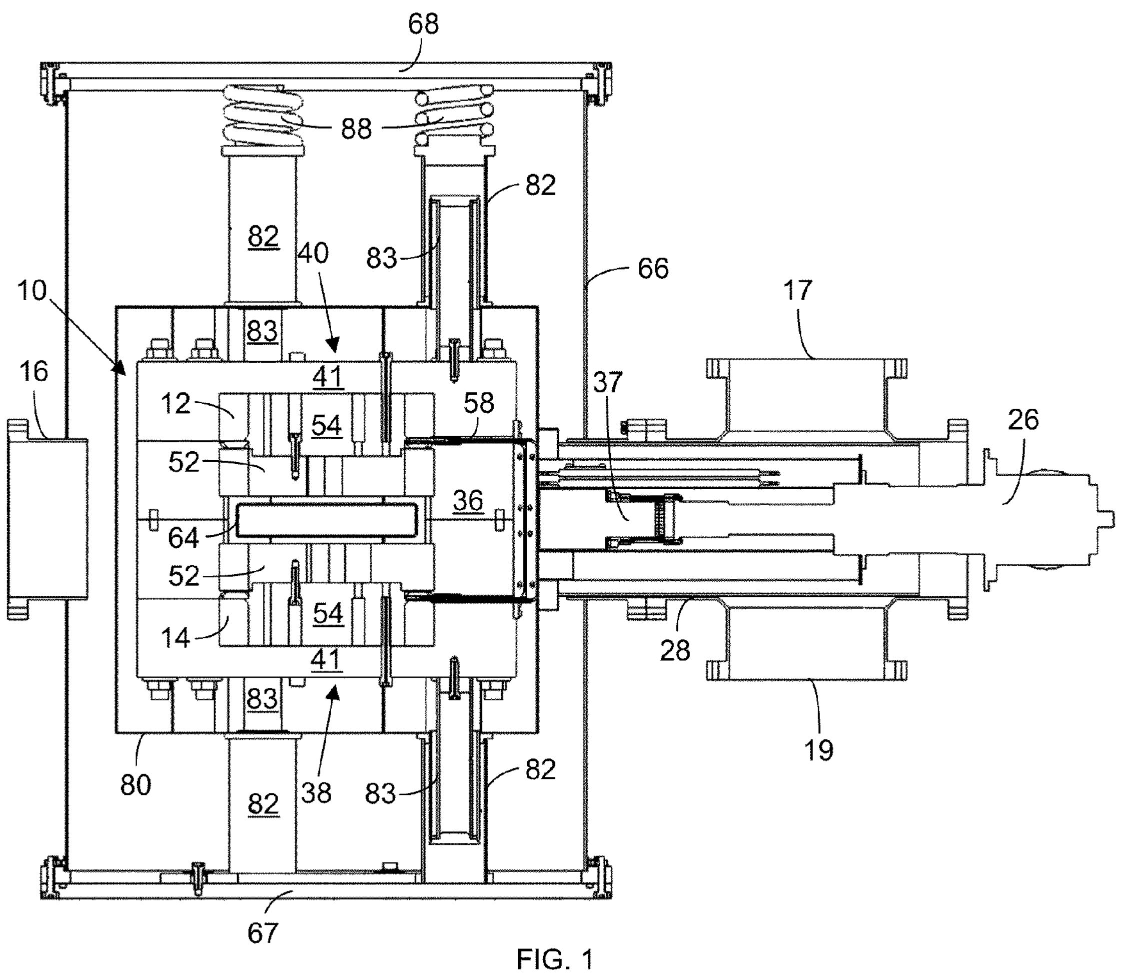
FIG. 1 is a sectional side illustration of an isochronous cyclotron and surrounding structure.

The foregoing and other features and advantages of various aspects of the invention(s) will be apparent from the following, more-particular description of various concepts and specific embodiments within the broader bounds of the invention(s). Various aspects of the subject matter introduced above and discussed in greater detail below may be implemented in any of numerous ways, as the subject matter is not limited to any particular manner of implementation. Examples of specific implementations and applications are provided primarily for illustrative purposes.

Unless otherwise defined, used or characterized herein, terms that are used herein (including technical and scientific terms) are to be interpreted as having a meaning that is consistent with their accepted meaning in the context of the relevant art and are not to be interpreted in an idealized or overly formal sense unless expressly so defined herein. For example, if a particular composition is referenced, the composition may be substantially, though not perfectly pure, as practical and imperfect realities may apply; e.g., the potential presence of at least trace impurities (e.g., at less than 1 or 2% by weight or volume) can be understood as being within the scope of the description; likewise, if a particular shape is referenced, the shape is intended to include imperfect variations from ideal shapes, e.g., due to machining tolerances.

Although the terms, first, second, third, etc., may be used herein to describe various elements, these elements are not to be limited by these terms. These terms are simply used to distinguish one element from another. Thus, a first element, discussed below, could be termed a second element without departing from the teachings of the exemplary embodiments.

Spatially relative terms, such as "above," "upper," "beneath," "below," "lower," and the like, may be used herein for ease of description to describe the relationship of one element to another element, as illustrated in the figures. It will be understood that the spatially relative terms, as well as the illustrated configurations, are intended to encompass different orientations of the apparatus in use or operation in addition to the orientations described herein and depicted in the figures. For example, if the apparatus in the figures is turned over, elements described as "below" or "beneath" other elements or features would then be oriented "above" the other elements or features. Thus, the exemplary term, "above," may encompass both an orientation of above and below; and the apparatus may be otherwise oriented (e.g., rotated 90 degrees or at other orientations) and the spatially relative descriptors used herein interpreted accordingly.

Further still, in this disclosure, when an element is referred to as being "on," "connected to" or "coupled to" another element, it may be directly on, connected or coupled to the other element or intervening elements may be present unless otherwise specified.

The terminology used herein is for the purpose of describing particular embodiments and is not intended to be limiting of exemplary embodiments. As used herein, the singular forms, such as "a" and "an," are intended to include the plural forms as well, unless the context clearly indicates otherwise. Additionally, the terms, "includes," "including," "comprises" and "comprising," specify the presence of the stated elements or steps but do not preclude the presence or addition of one or more other elements or steps.

An embodiment of an isochronous cyclotron is shown in FIGS. 1-10 from various perspectives and via various sections. The isochronous cyclotron includes a magnetic yoke 10 with a pair of poles 38 and 40, each including a pole cap 41, a pole base 54, and a plurality of spiral-shaped pole tips 52, and a return yoke 36 that contain at least a portion of a beam chamber 64 that contains a section of a median acceleration plane for ion acceleration. The poles 38 and 40 exhibit approximate mirror symmetry across the median acceleration plane and are joined at the perimeter of the magnetic yoke 10 by a return yoke 36.

Figure 2:
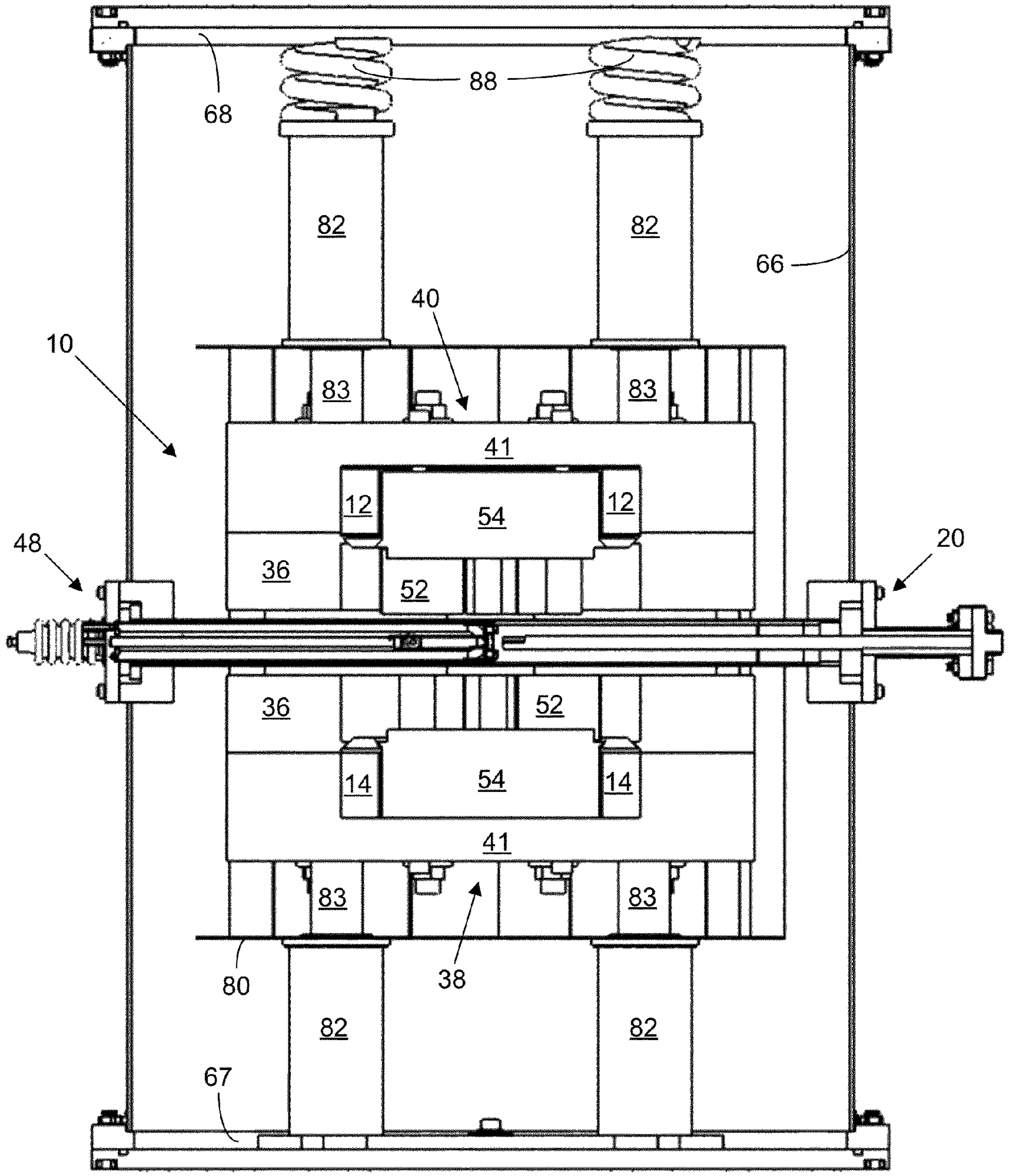
FIG. 2 is a magnified sectional view of the isochronous cyclotron of FIG. 1.
Figure 4:
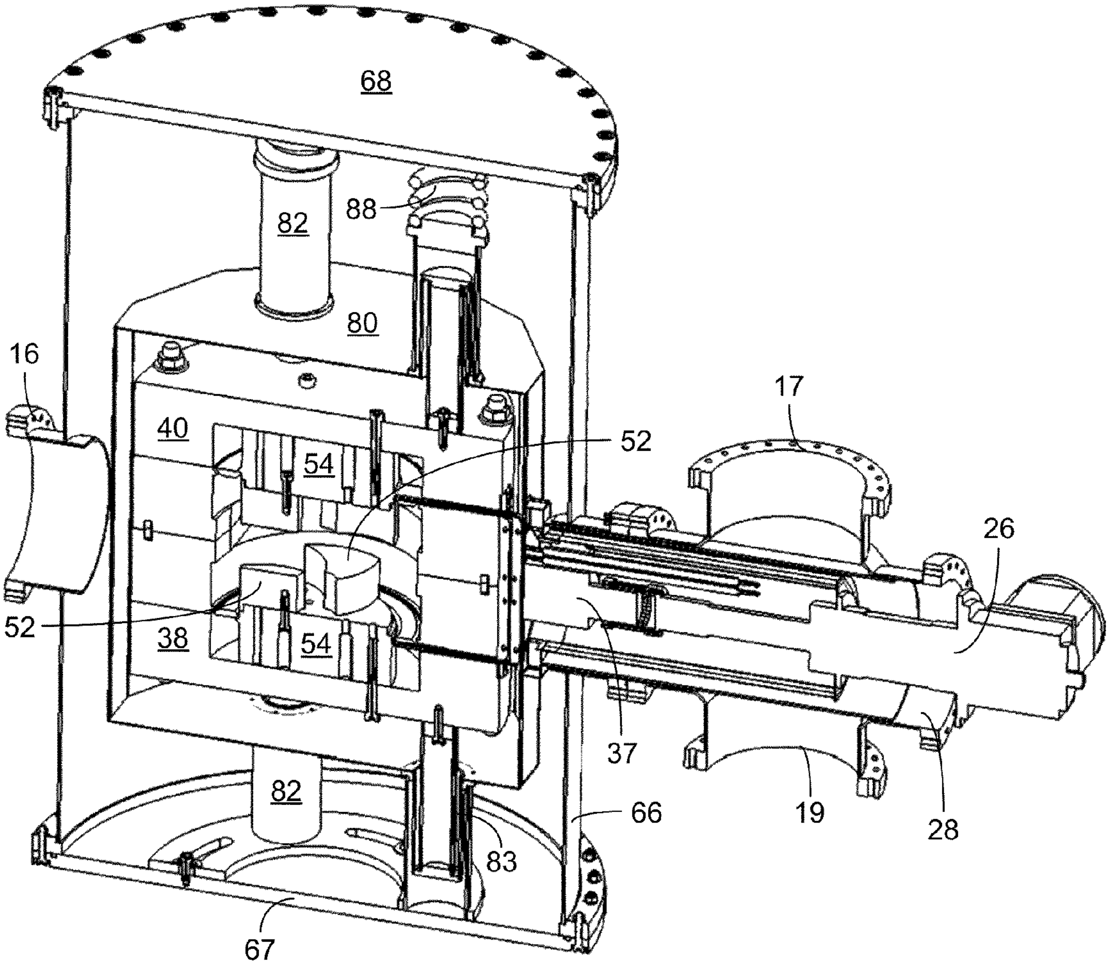
FIG. 4 is a perspective side-sectional view of the isochronous cyclotron of FIG. 1.

As shown in FIGS. 1, 2 and 4, the yoke 10 of the isochronous cyclotron is supported and positioned by structural spacers 82 formed of a composition with poor thermal conductivity, such as an epoxy-glass composite, carbon composites or a thin-walled metallic (e.g., stainless steel) structure, with spacer extensions 83 that form a tortuous structural pathway between the outer cryostat 66 and the intermediate thermal shield 80 (e.g., at 45K) to limit heat transfer there between, as the spacers 82 and spacer extensions 83 provide the structural support between the outer cryostat 66 (formed, e.g., of stainless steel or low-carbon steel and providing a vacuum barrier within the contained volume) and the thermal shield 80 (formed, e.g., of copper or aluminum). A compression spring 88 holds the intermediate thermal shield 80 and the isochronous cyclotron contained therein in compression.

A pair of superconducting magnetic coils 12 and 14 (i.e., coils that can generate a magnetic field) are contained in and are in contact with the upper and lower poles 38 and 40, respectively, and the return yoke 36 of the magnetic yoke 10 (i.e., without being fully separated by a cryostat or by free space) such that the yoke 10 provides support for and is in thermal contact with the superconducting magnetic coils 12 and 14. Consequently, the superconducting magnetic coils 12 and 14 are not subject to external decentering forces, and there is no need for tension links to keep the superconducting magnetic coils 12 and 14 centered within the cryostat 66. In alternative embodiments, the magnetic coils 12 and 14 may not be in direct thermal contact with the yoke 10, wherein the cryogenic refrigerator 26 can separately cool the magnetic coils 12 and 14 and the yoke 10 (e.g., the coils 12 and 14 can be thermally coupled with a second stage of the cryogenic refrigerator at 4K, while the yoke can be thermally coupled with a first stage of the cryogenic refrigerator at 40K). In other embodiments, the thermal coupling can include a thermal barrier placed between the coils 12 and 14 and the yoke 10, allowing cooling of the yoke to 50K or lower, though providing for a temperature difference between the coils 12 and 14 and the yoke 10. In still other embodiments, the thermal coupling can include liquid nitrogen in thermal contact with the cryogenic refrigerator 26 and also in contact with the yoke 10 and the coils 12 and 14 to provide cooling to each.

The superconducting coils 12 and 14 are supplied with electric current via an electric current lead coupled with a voltage source and fed through a lead port 17 in the cryostat to provide current to the low-temperature conductive lead link 58, which is thermally coupled with the coils 12 and 14.

The magnetic coils 12 and 14 comprise superconductor cable or cable-in-channel conductor with individual cable strands having a diameter of 0.3 mm to 1.2 mm (e.g., 0.6 mm) and wound to provide a current carrying capacity of, e.g., between 4 million to 6 million total amps-turns. In one embodiment of a cable-in-channel conductor, where each strand has a superconducting current-carrying capacity of 1,000-2,000 amperes, 3,000 windings of the strand are provided in the coil to provide a capacity of 3-6 million amps-turns in the coil. In another embodiment, a single-strand cable can carry 100-400 amperes and provide about a million amps-turns. In general, the coil can be designed with as many windings as are needed to produce the number of amps-turns needed for a desired magnetic field level without exceeding the critical current carrying capacity of the superconducting strand. The superconducting material can be a low-temperature superconductor, such as niobium titanium (NbTi), niobium tin ($Nb_3Sn$), or niobium aluminum ($Nb_3Al$); in particular embodiments, the superconducting material is a type II superconductor—in particular, $Nb_3Sn$ having a type A15 crystal structure. High-temperature superconductors, such as $Ba_2Sr_2Ca_1Cu_2O_8$, $Ba_2Sr_2Ca_2Cu_3O_{10}$, $MgB_2$ or $YBa_2Cu_3O_{7-x}$, can also be used.

The coils can be formed directly from cables of superconductors or cable-in-channel conductors. In the case of niobium tin, unreacted strands of niobium and tin (in a 3:1 molar ratio) may also be wound into cables. The cables are then heated to a temperature of about 650° C. to react the niobium and tin to form $Nb_3Sn$. The $Nb_3Sn$ cables are then soldered into a U-shaped copper channel to form a composite conductor. The copper channel provides mechanical support, thermal stability during quench; and a conductive pathway for the current when the superconducting material is normal (i.e., not superconducting). The composite conductor is then wrapped in glass fibers and then wound in an outward overlay. Strip heaters formed, e.g., of stainless steel can also be inserted between wound layers of the composite conductor to provide for rapid heating when the magnet is quenched and also to provide for temperature balancing across the radial cross-section of the coil after a quench has occurred, to minimize thermal and mechanical stresses that may damage the coils. After winding, a vacuum is applied, and the wound composite conductor structure is impregnated with epoxy to form a fiber/epoxy composite filler in the final coil structure. The resultant epoxy-glass composite in which the wound composite conductor is embedded provides electrical insulation and mechanical rigidity. Features of these magnetic coils and their construction are further described and illustrated in U.S. Pat. No. 7,696,847 B2 and in US Patent Application Publication No. 2010/0148895 A1.

In other embodiments, the coils 12 and 14 can be made of individual strands (small round wires) and wet wound with epoxy then cured, or dry wound and impregnated after winding to form a composite coil.

Each coil 12/14 is covered by a ground-wrap additional outer layer of epoxy-glass composite and a thermal overwrap of tape-foil sheets formed, e.g., of copper or aluminum, as described in U.S. patent application Ser. No. 12/951,968. The thermal overwrap is in thermal contact with both a low-temperature conductive link 58 for cryogenic cooling and with the pole cap 41, pole base 54 and return yoke 36, though contact between the thermal overwrap and the pole cap and base and return yoke 36 may or may not be over the entire surface of the overwrap (e.g., direct or indirect contact may be only at a limited number of contact areas on the adjacent surfaces). Characterization of the low-temperature conductive link 58 and the yoke 10 as being in "thermal contact" means either that there is direct contact between the conductive link 58 and the yoke or that there is physical contact through one or more thermally conductive intervening materials [e.g., having a thermal conductivity greater than 0.1 W/(m·K) at the operating temperature], such as a thermally conductive filler material of suitable differential thermal contraction that can be mounted between and flush with the thermal overwrap and the low-temperature conductive link 58 to accommodate differences in thermal expansion between these components with cooling and warming of the isochronous cyclotron.

The low-temperature conductive link 58, in turn, is thermally coupled with a cryocooler thermal link 37 (shown in FIGS. 1 and 4-8), which, in turn, is thermally coupled with the cryocooler 26 (shown in FIGS. 1 and 4-10). Accordingly, the thermal overwrap provides thermal contact among the cryocooler 26, the yoke 10 and the superconducting coils 12 and 14.

Finally, a filler material of suitable differential thermal contraction can be mounted between and flush with the thermal overwrap and the low-temperature conductive link 58 to accommodate differences in thermal expansion between these components with cooling and warming of the magnet structure.

The superconducting magnetic coils 12 and 14 circumscribe the region of the beam chamber 64 in which the ions are accelerated, on opposite sides of the median acceleration plane 18 (see FIG. 14) and serve to directly generate extremely high magnetic fields in the median acceleration plane 18. When activated via an applied voltage, the magnetic coils 12 and 14 further magnetize the yoke 10 so that the yoke 10 also produces a magnetic field, which can be viewed as being distinct from the field directly generated by the magnetic coils 12 and 14.

The magnetic coils 12 and 14 are substantially (azimuthally) symmetrically arranged about a central axis 16 equidistant above and below the median acceleration plane 18 in which the ions are accelerated. The superconducting magnetic coils 12 and 14 are separated by a sufficient distance to allow for at least one pair of RF acceleration electrode plates 49 and a surrounding super-insulation layer to extend there between in the beam chamber 64, inside of which a temperature at or near room temperature (e.g., about 10° C. to about 30° C.) can be maintained. Each coil 12/14 includes a continuous path of conductor material that is superconducting at the designed operating temperature, generally in the range of 4-40K, but also may be operated below 2K, where additional superconducting performance and margin is available. Where the cyclotron is to be operated at higher temperatures, superconductors, such as bismuth strontium calcium copper oxide (BSCCO), yttrium barium copper oxide (YBCO) or $MgB_2$, can be used.

A compact cold cyclotron of this disclosure designed to produce a 12.5-MeV beam can have an inner coil radius of about 10 cm and a cross-section 3.5 cm wide and 6 cm high (in the orientation of FIGS. 1 and 2). The coils 12 and 14 can also be separated by a distance of 198 mm on opposite sides of the median acceleration plane. The isochronous cyclotron can be scaled to accelerate ions to higher voltages by increasing the radius of the coils and the rest of the magnet structure. The apparatus can also be scaled for ions heavier than protons—for a given magnet size and field strength, the total energy of a heavier ion (e.g., deuterium or heavier) after acceleration will be less than or equal to half the energy of an accelerate proton, so less vertical focusing and less field increase with radius can be provided by the magnet structure for a heavier ion.

With the high magnetic fields, the magnet structure can be made exceptionally small. In one embodiment, the outer radius of the magnetic yoke 10 is about 2.4 times the radius, r, from the central axis 16 to the inner edge of the magnetic coils 12 and 14, while the height of the magnetic yoke 10 (measured parallel to the central axis) is about two times the radius, r.

Together, the magnetic coils 12 and 14 and the yoke 10 [including the return yoke 36, pole caps 41, pole bases 54 (if formed of a magnetic material), and sector pole tips 52] generate a combined field, e.g., of at least 6 Tesla in the median acceleration plane 18 at the inner radius for ion introduction and higher fields at greater radii. The magnetic coils 12 and 14 can generate a majority of the magnetic field in the median acceleration plane, e.g., greater than 3 Tesla when a voltage is applied thereto to initiate and maintain a continuous superconducting current flow through the superconducting magnetic coils 12 and 14. The yoke 10 is magnetized by the field generated by the superconducting magnetic coils 12 and 14 and can contribute up to another 3 Tesla or more (when the pole tips are formed of a rare earth ferromagnet) to the magnetic field generated in the chamber for ion acceleration.

Figure 12:
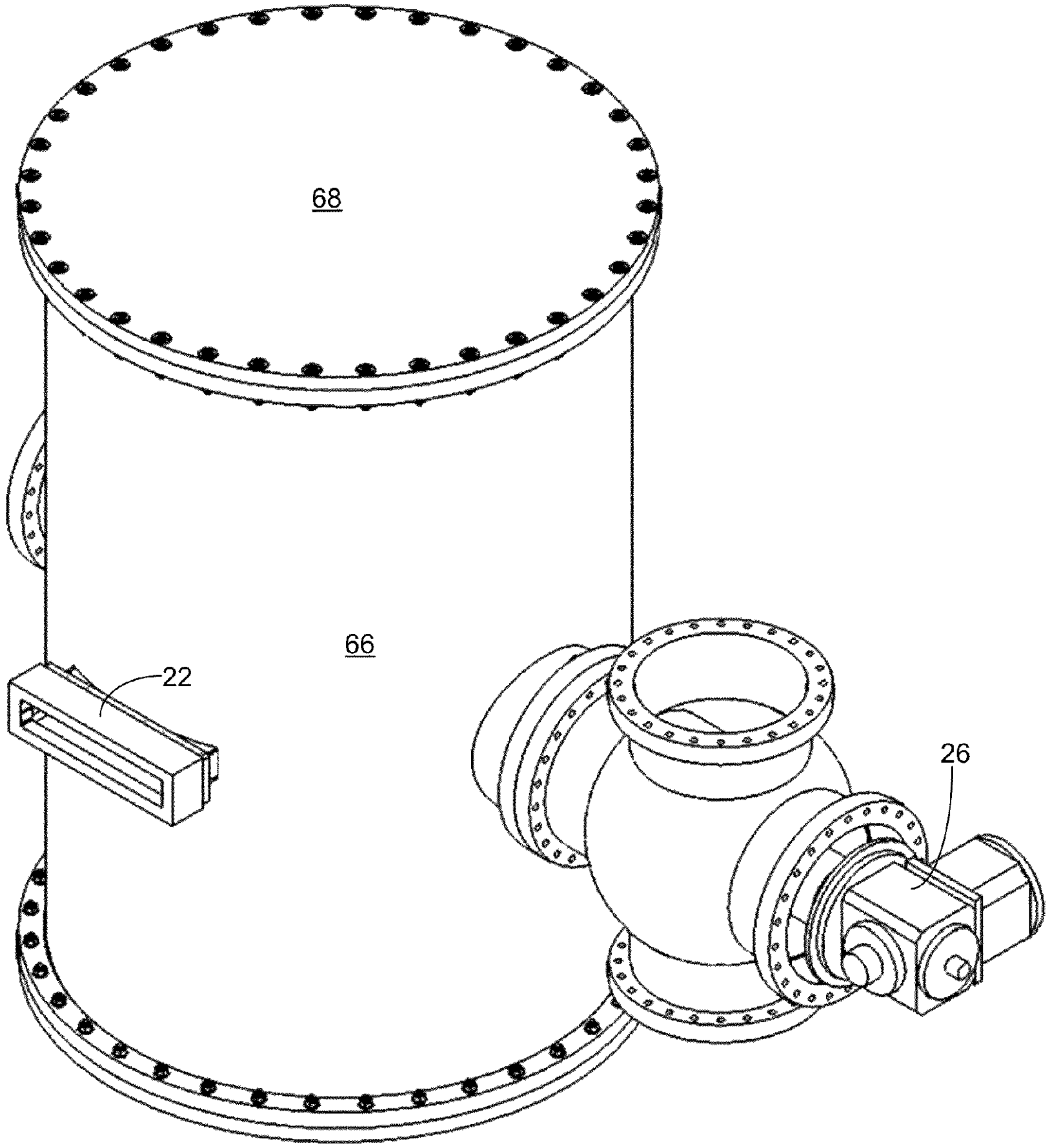
FIG. 12 is a perspective exterior view of the cryostat containing the isochronous cyclotron of FIG. 1.

Both of the magnetic field components (i.e., both the field component generated directly from the coils 12 and 14 and the field component generated by the magnetized yoke 10) pass through the median acceleration plane 18 approximately orthogonal to the median acceleration plane 18, as shown in FIG. 12. The magnetic field generated by the fully magnetized yoke 10 at the median acceleration plane 18 in the chamber, even at the magnetic flutter pole tips, however, is smaller than the magnetic field generated directly by the magnetic coils 12 and 14 at the median acceleration plane 18. The yoke 10 is configured to shape the magnetic field along the median acceleration plane 18 so that the magnetic field increases with increasing radius from the central axis 16 to the radius at which ions are extracted in the beam chamber 64 to compensate for relativistic particle mass gain during acceleration.

The voltage to maintain ion acceleration is provided at all times via the current lead 47 to a pair of semi-circular, high-voltage electrode plates 49 that are oriented parallel to and above and below the media acceleration plane inside the beam chamber 64. The yoke 10 is configured to provide adequate space for the beam chamber 64 and for the electrode apparatus 48, which extends through a vacuum feed-through 62. The electrode apparatus is formed of a conductive metal. In alternative embodiments, two electrodes spaced 180° apart about the central axis 16 can be used. The use of two-electrode apparatus can produce higher gain per turn of the orbiting ion and better centering of the ion's orbit, reducing oscillation and producing a better beam quality. Alongside the RF current lead 47 is an RF high voltage feed-through 42 used to excite the dees 49 to have an oscillating voltage at the cyclotron frequency or at an integer multiple of the cyclotron frequency.

During operation, the superconducting magnetic coils 12 and 14 can be maintained in a "dry" condition (i.e., not immersed in liquid refrigerant); rather, the magnetic coils 12 and 14 can be cooled to a temperature below the superconductor's critical temperature (e.g., as much as 5K below the critical temperature, or in some cases, less than 1K below the critical temperature) by one or more cryogenic refrigerators 26 (cryocoolers). In other embodiments, the coils can be in contact with a liquid cryogen for heat transfer from the coils 12 and 14 to the cryogenic refrigerator 26. When the magnetic coils 12 and 14 are cooled to cryogenic temperatures (e.g., in a range from 4K to 30K, depending on the composition), the yoke 10 is likewise cooled to approximately the same temperature due to the thermal contact among the cryocooler 26, the magnetic coils 12 and 14 and the yoke 10.

Figure 5:
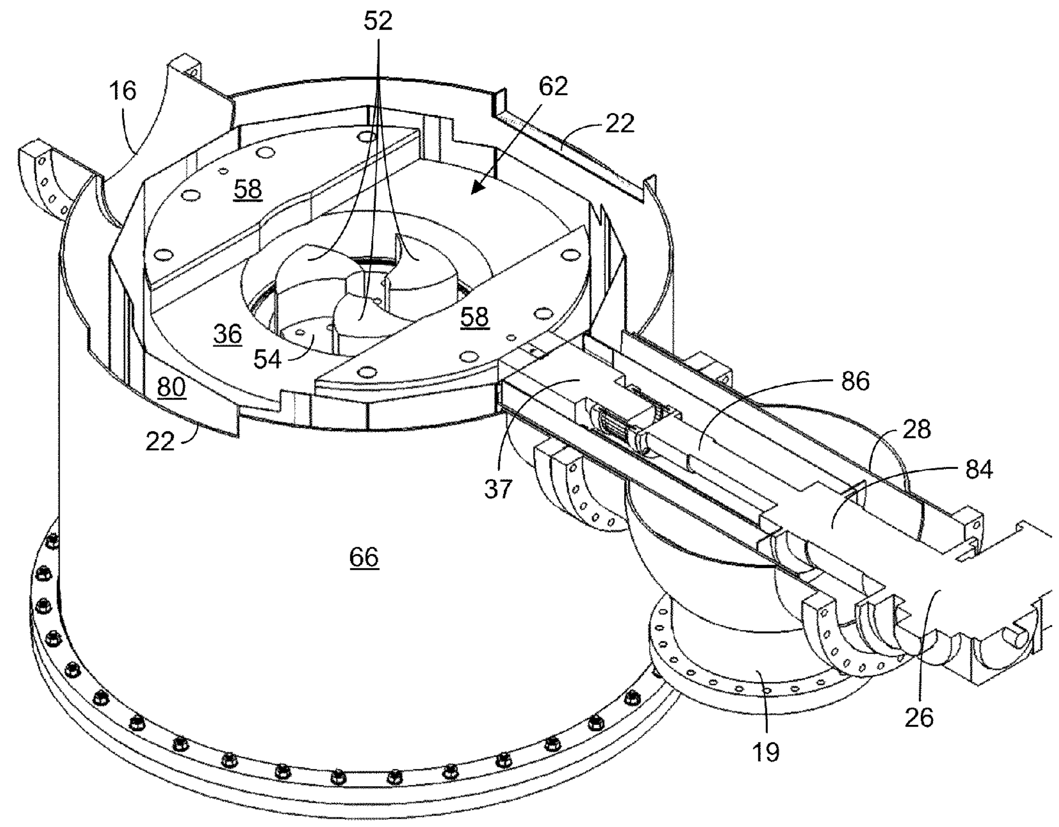
FIG. 5 is a perspective top-sectional view of the isochronous cyclotron of FIG. 1.
Figure 6:
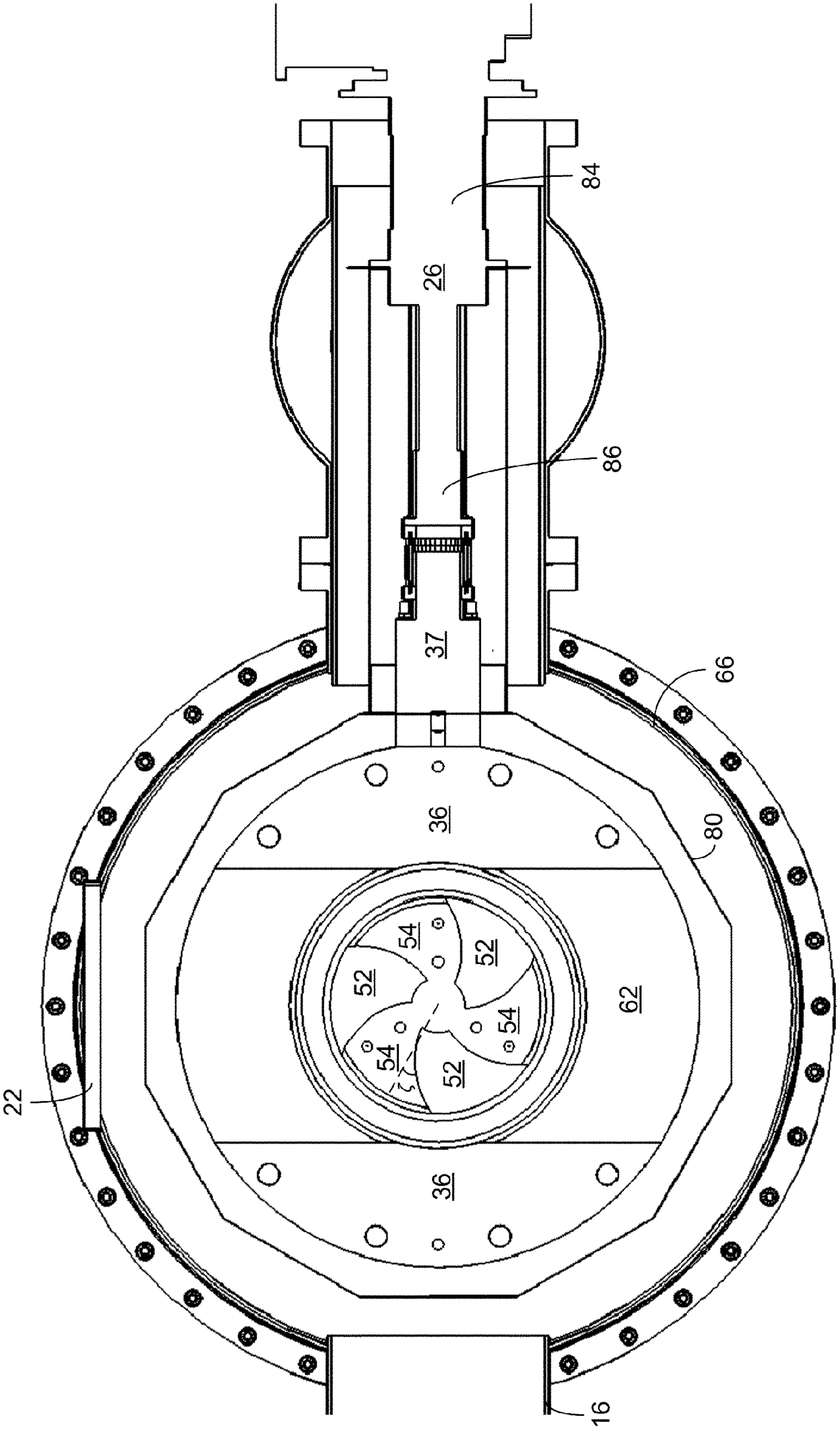
FIG. 6 is a top sectional view of the isochronous cyclotron of FIG. 1 showing the sector pole tips without the electrode assembly.

The cryocooler 26 can utilize compressed helium in a Gifford-McMahon refrigeration cycle or can be of a pulse-tube cryocooler design with a higher-temperature first stage 84 and a lower-temperature second stage 86 (shown in FIGS. 5 and 6). The lower-temperature second stage 86 of the cryocooler 26 can be operated at about 4.5 K and is thermally coupled via thermal links 37 and 58 including low-temperature-superconductor current leads (formed, e.g., of NbTi) that include wires that connect with opposite ends of the composite conductors in the superconducting magnetic coils 12 and 14 and with a voltage source to drive electric current through the coils 12 and 14. The cryocooler 26 can cool each low-temperature conductive link 58 and coil 12/14 to a temperature (e.g., about 4.5 K) at which the conductor in each coil is superconducting. Alternatively, where a higher-temperature superconductor is used, the second stage 86 of the cryocooler 26 can be operated at, e.g., 4-30 K.

The warmer first stage 84 of the cryocooler 26 can be operated at a temperature of, e.g., 40-80 K and can be thermally coupled with the intermediate thermal shield 80 that is accordingly cooled to, e.g., about 40-80 K to provide an intermediate-temperature barrier between the magnet structure (including the yoke 10 and other components contained therein) and the cryostat 66, which can be at room temperature (e.g., at about 300 K). As shown in FIGS. 1, 2, 4 and 8-10, the cryostat 66 includes a cryostat base plate 67 and a cryostat top plate 68 at opposite ends of the cylindrical side wall. The cryostat also includes a vacuum port 19 (shown in FIGS. 1, 4 and 5) to which a vacuum pump can be coupled to provide a high vacuum inside the cryostat 66 and thereby limit convection heat transfer between the cryostat 66, the intermediate thermal shield 80 and the magnet structure 10. The cryostat 66, thermal shield 80 and the yoke 10 are each spaced apart from each other an amount that minimizes conductive heat transfer and structurally supported by insulating spacers 82.

The magnetic yoke 10 provides a magnetic circuit that carries the magnetic flux generated by the superconducting coils 12 and 14 to the beam chamber 64. The magnetic circuit through the magnetic yoke 10 (in particular, the azimuthally varying field provided by the sector pole tips 52) also provides field shaping for strong focusing of ions in the beam chamber 64. The magnetic circuit also enhances the magnetic field levels in the portion of the beam chamber 64 through which the ions accelerate by containing most of the magnetic flux in the outer part of the magnetic circuit. In a particular embodiment, the magnetic yoke 10 (except the pole tips 52, which can be formed of a rare earth magnet) is formed of low-carbon steel, and it surrounds the coils 12 and 14 and an inner super-insulation layer surrounding the beam chamber 64 and formed, e.g., of aluminized Mylar polyester film (available from DuPont) and paper. Pure iron may be too weak and may possess an elastic modulus that is too low; consequently, the iron can be doped with a sufficient quantity of carbon and other elements to provide adequate strength or to render it less stiff while retaining the desired magnetic levels. In alternative embodiments, the outer yoke can be formed of gadolinium.

Figure 10:
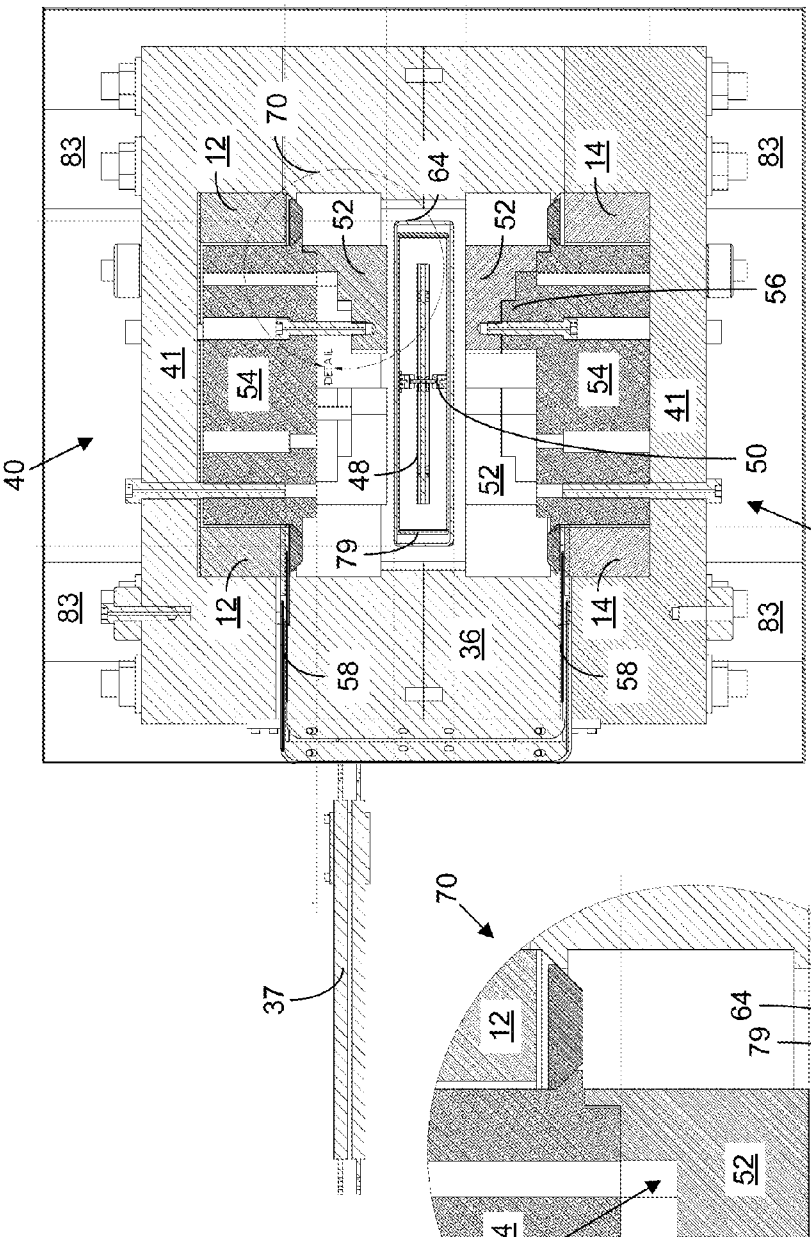
FIG. 10 is a section side view of an isochronous cyclotron.

In particular embodiments of the compact, cold, superconducting isochronous cyclotron, as shown, e.g., in FIG. 10, the distance between the magnetic flutter pole tips 52 on opposite sides of the median acceleration plane can be about 56 mm, while the height of each pole base 54 (wherein "height," as used herein, is measured vertically per the orientation of the figures) omitting the protrusions 56 can be about 84 mm. Meanwhile, the height of each magnetic pole cap 41 can be about 40 mm. The beam chamber 64 can have a height of 42 mm and a width of 230 mm. Each of the coils 12 and 14 can have an inner diameter of about 202 mm, an outer diameter of about 230 nm and a height of 60 mm.

In particular embodiments, the pole cap 41 and pole base 54 are formed of iron, while the pole tips 52 can be formed of a rare earth metal (such as holmium, gadolinium or dysprosium), which can provide a particularly strong magnetic force. Where the pole tips 52 are formed of a rare earth magnet, a magnet of field of 9 Tesla can be generated in the median acceleration plane (versus, e.g., 6-8 Tesla where the pole tips are formed of iron). In particular embodiments, the pole base 54 and/or the pole cap 41 can also be formed of a rare earth magnet. In some embodiments, the pole base 54 is formed of a non-magnetic material (e.g., aluminum) to "float" the pole tips 52, such that the pole tips 52 are spatially segregated from the rest of the yoke 10 by non-magnetic material, and to facilitate magnetic saturation of the pole tips 52. The illustrated embodiment includes three pole tips 52 on each side of the median acceleration plane 18, though other embodiments can include, for example, four or six evenly spaced pole tips 52 on each side of the median acceleration plane 18.

Figure 11:
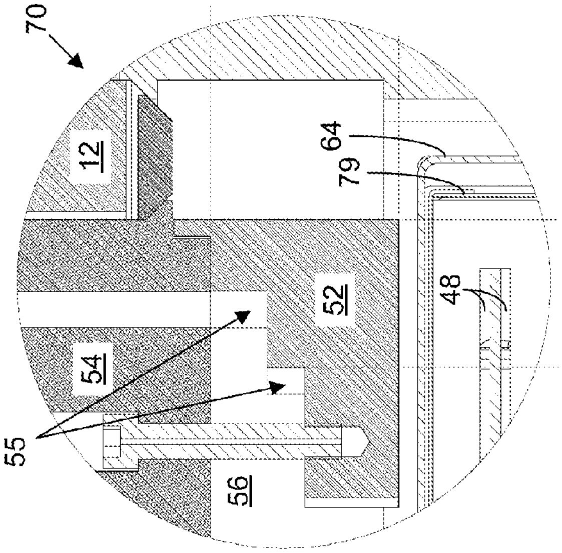
FIG. 11 is a magnified view of section 70 from FIG. 10.

The spiral-shaped pole tips 52 serve as sector magnets to provide the azimuthal variation in the magnetic field, wherein the spiral shape enhances the variation in the field (i.e., the "flutter"). The spiral-shaped pole tips 52 can include cut-outs (cavities) 55, as shown in FIGS. 10 and 11, on an outer side opposite from the surfaces of the tips 52 that face inward toward the median acceleration plane 18. These cut-outs 55 allow for increased magnetic field at greater radii to obtain the desired radial field profile; i.e., the greater the increase in height of the pole tips 52 (measured in the z direction, parallel to the central axis) from a cut-out 55 to the outer radius of the pole tips 52, the greater the increase in magnetic field with radius). The surface of the pole base 54 (formed, e.g., of aluminum) that interfaces with the pole tips can have a complementary profile such that sectors of the inner surface of the pole base 54 extends toward the median acceleration plane to file the cut-outs 55 in the pole tips 52, as shown in FIG. 10.

As shown in the magnified view of the magnetic flutter pole tips 52, provided in FIG. 11, the heights of the three main steps of the tips 52 are 25 mm, 35 mm, and 50 mm (moving left to right in FIG. 11), while the radial width (measured horizontally from the innermost tip surface to the outermost tip surface) of these three steps are 74 mm, 39 mm, and 19 mm.

Ions can be generated by an internal ion source 50 (shown in FIGS. 3 and 7) positioned proximate (i.e., slightly offset from) the central axis of the yoke or can be provided by an external ion source via an ion-injection structure. An example of an internal ion source 50 can be, for example, a heated cathode coupled to a voltage source and proximate to a source of hydrogen gas. The accelerator electrode plates 49 are coupled via an electrically conductive pathway with a radiofrequency voltage source that generates a fixed-frequency oscillating electric field to accelerate emitted ions from the ion source 50 in an expanding outward orbit from a central axis in the beam chamber 64. The ions also undergo orthogonal oscillations around this average trajectory. These small oscillations about the average radius are known as betatron oscillations, and they define particular characteristics of accelerating ions.

Figure 7:
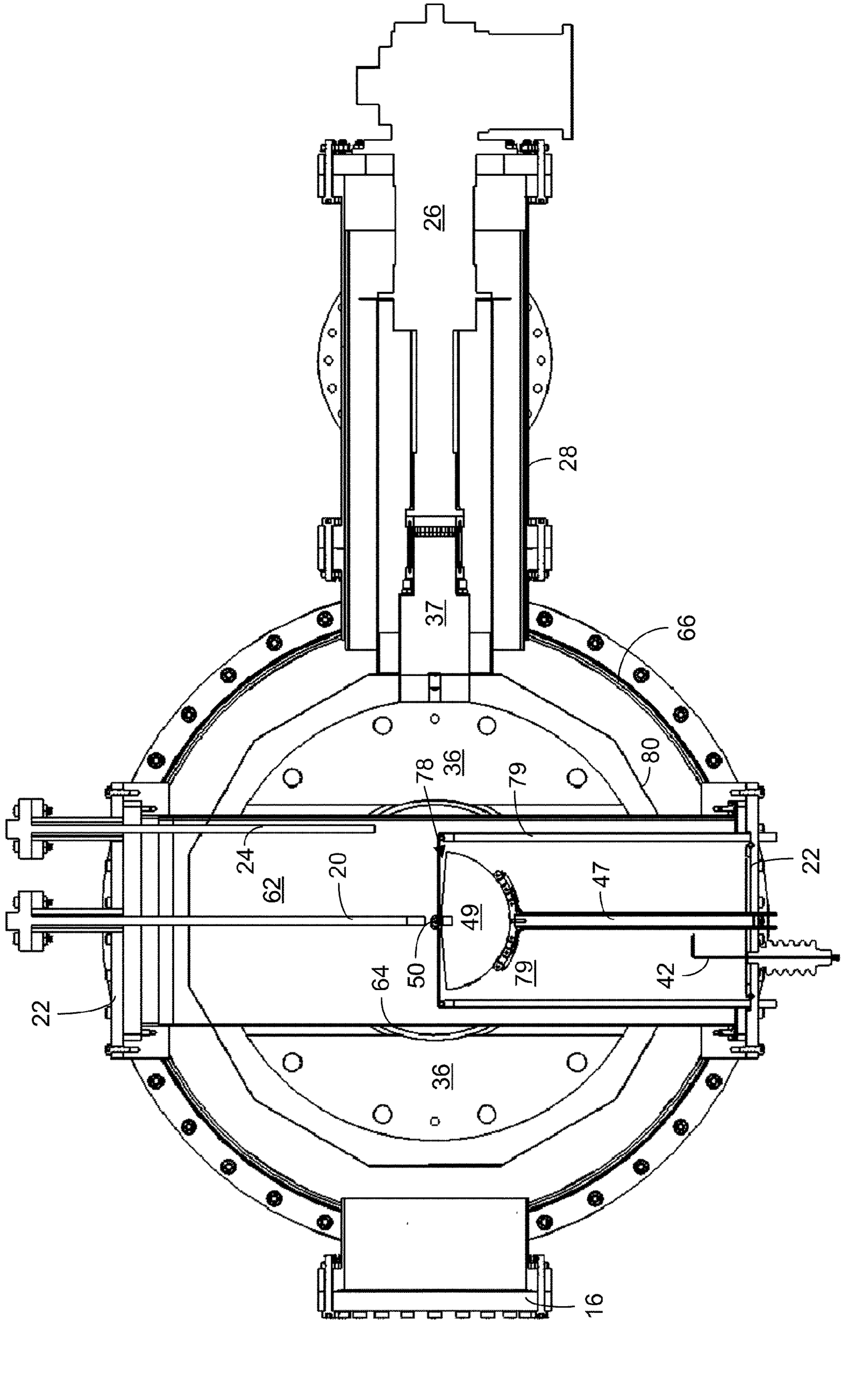
FIG. 7 is a top sectional view of the isochronous cyclotron of FIG. 1 showing the electrode assembly above the sector pole tips shown in FIG. 6.
Figure 8:
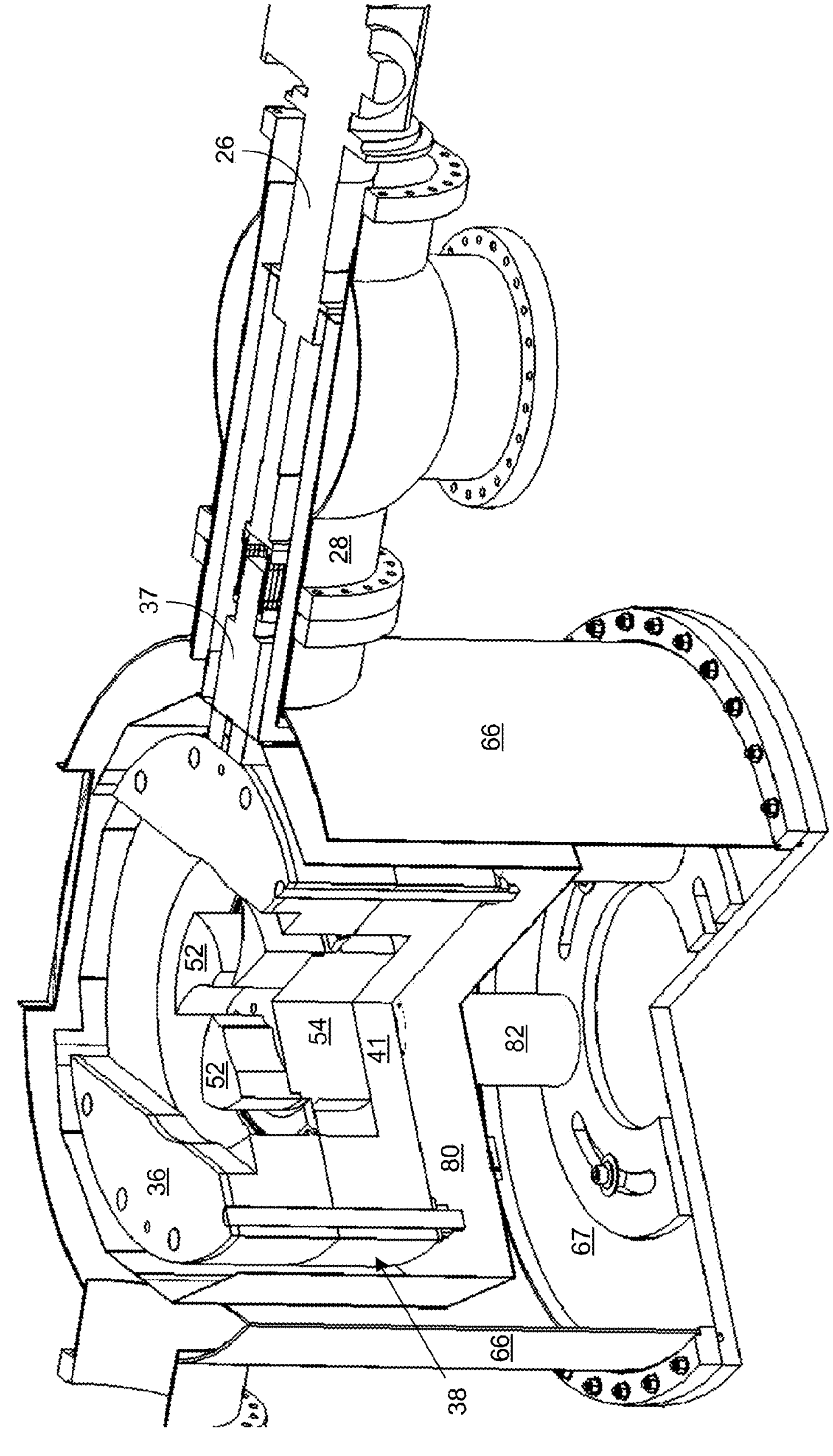
FIG. 8 is a perspective top-and-side sectional view of the isochronous cyclotron of FIG. 1.
Figure 9:
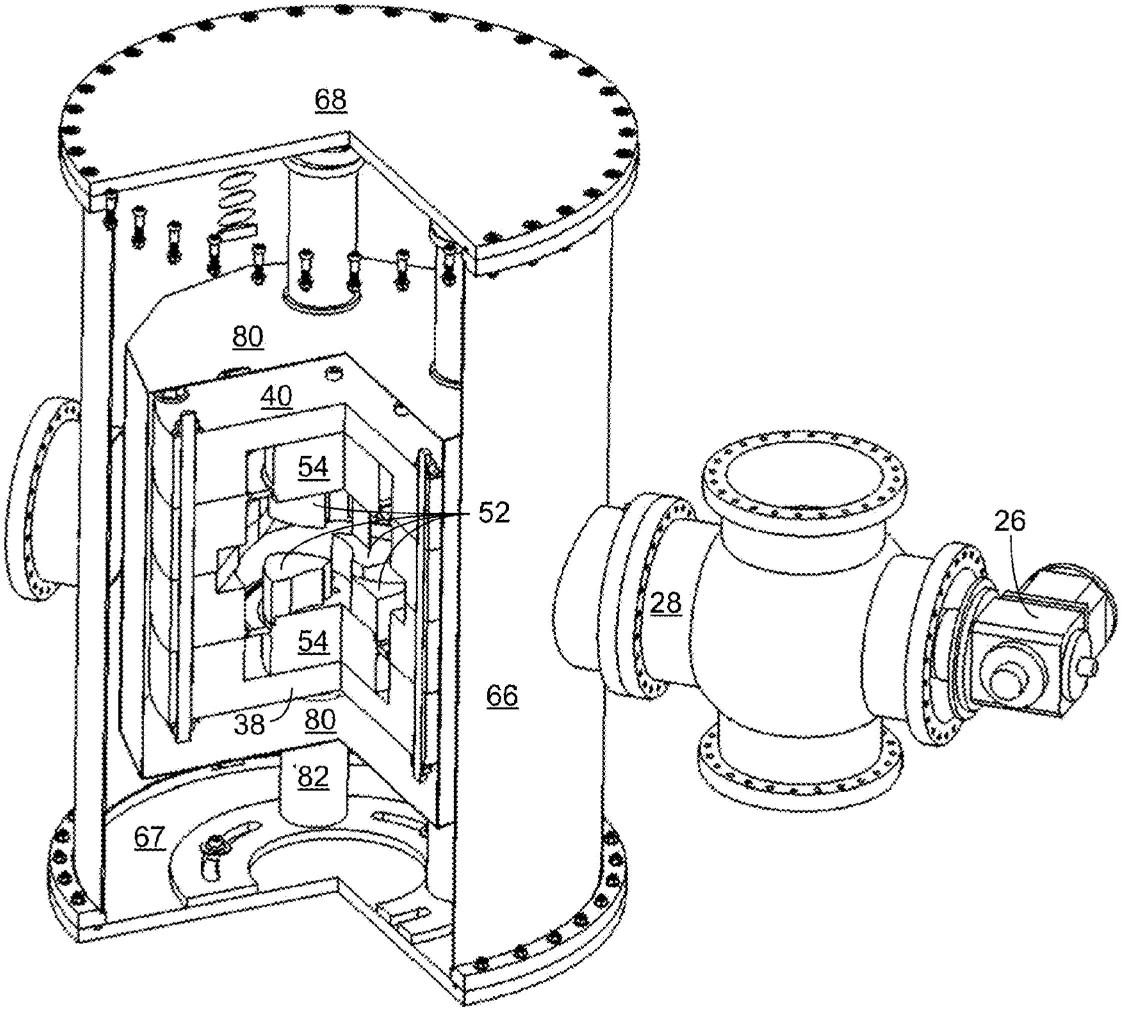
FIG. 9 is a perspective angled-side sectional view of the isochronous cyclotron of FIG. 1.
Figure 16:
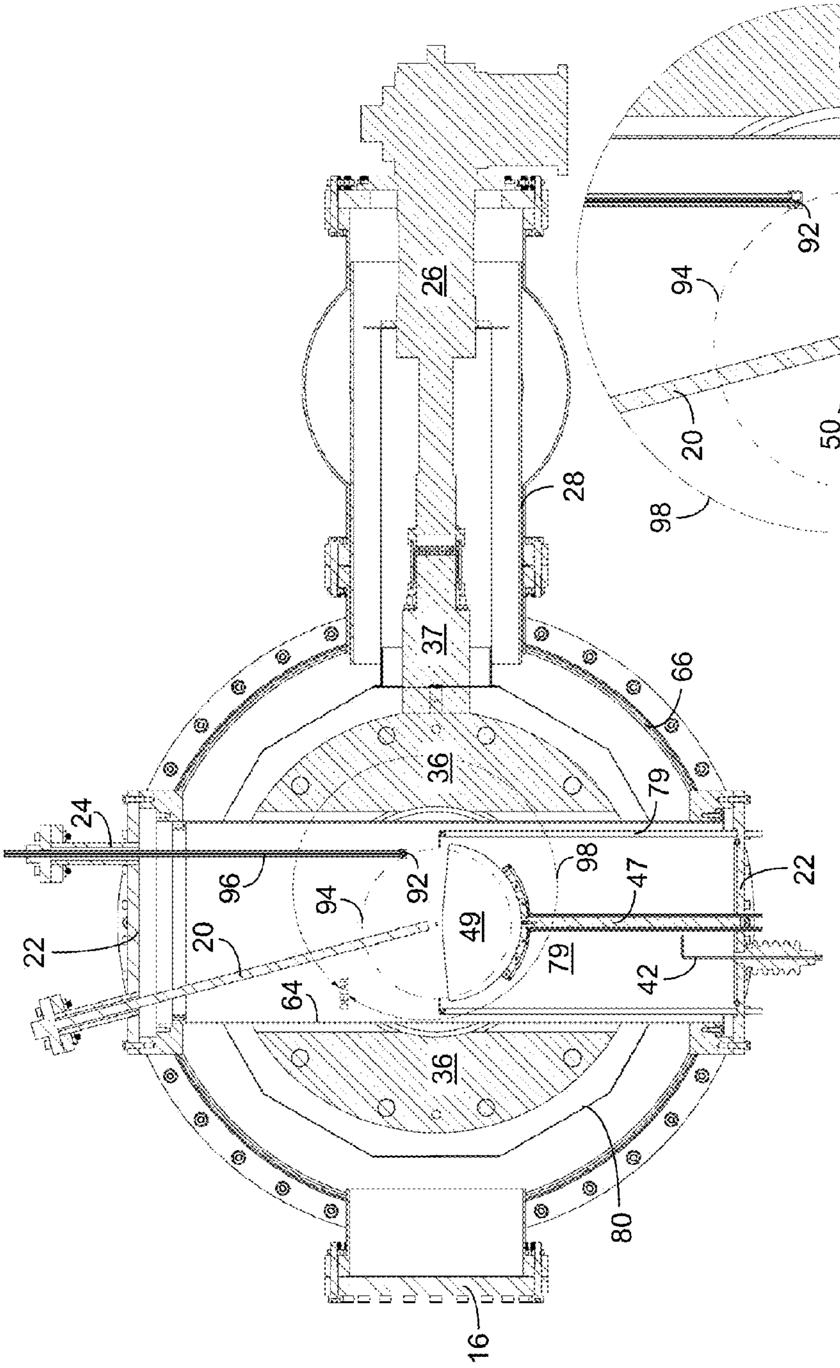
FIG. 16 is a top sectional view of an isochronous cyclotron with an internal secondary beam target.
Figure 18:
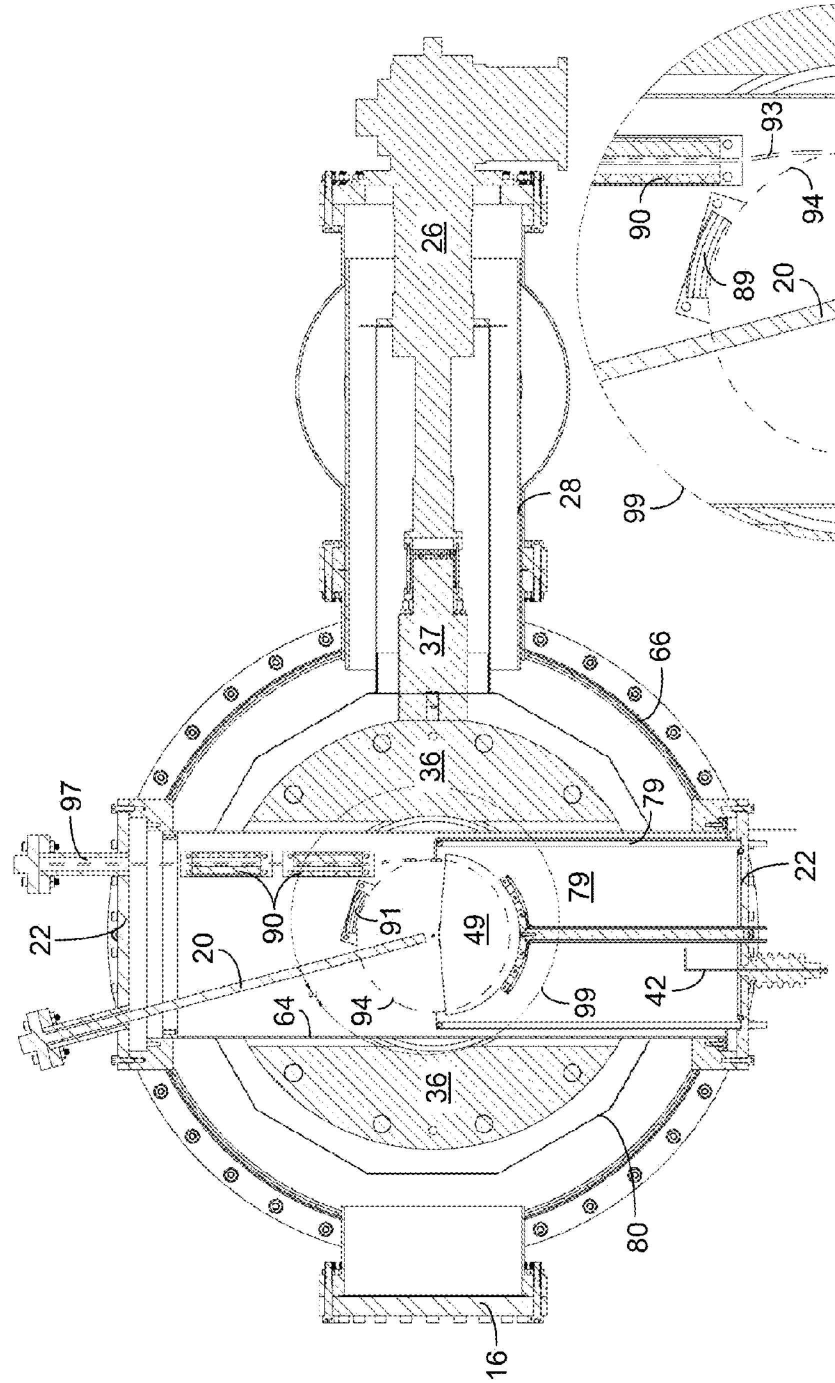
FIG. 18 is a top sectional view of an isochronous cyclotron with quadruple magnets for ion extraction.

An axial and radial ion beam probe 20 along with an internal secondary beam target 24 can be fed through the yoke 10 via access port 22 in the side of the cryostat 66, as shown in FIGS. 7, 16 and 18. The axial and radial ion beam probe 20 measures the current versus the radius of the accelerating ion during diagnostic evaluations of the isochronous cyclotron. During normal operation of the isochronous cyclotron, the axial and radial ion beam probe 20 is retracted away from the central axis and out of the path of the accelerating ions so as not to interfere with ion acceleration.

Figure 17:
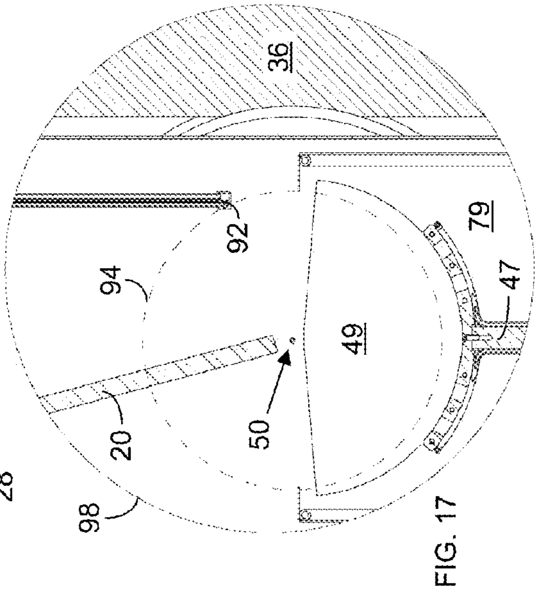
FIG. 17 is a magnified view of section 98 from FIG. 16.

The internal secondary beam target 24 is further illustrated in FIGS. 16 and 17; and it includes an interchangeable liquid (e.g., $H_2O$), solid (e.g., $^{11}B$) or gaseous ($^{14}N_2$) target 92, which produces a secondary ion (e.g., $^{13}NH_3$) when struck with a proton from an outer orbit 94 after being accelerated in the isochronous cyclotron; and the secondary ion is removed from the beam chamber 64 through the conduit 96 extending through the beam chamber access port 22 from the target 92.

Figure 19:
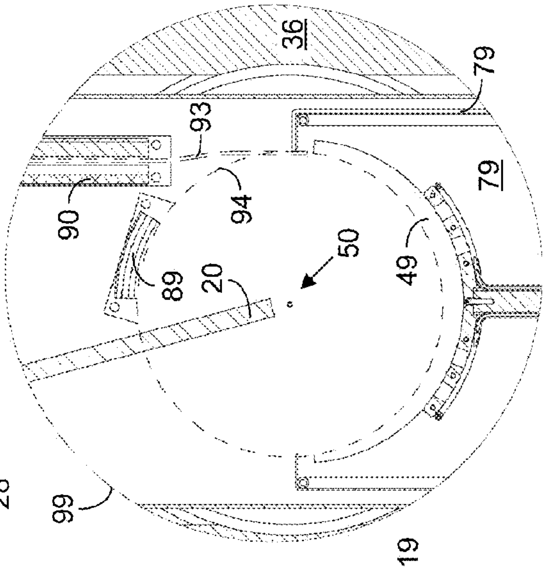
FIG. 19 is a magnified view of section 99 from FIG. 18.

In an alternative embodiment, shown in FIGS. 18 and 19, the accelerated ion is extracted from its outer orbit 94 with a perimeter magnet 89 (for providing a local enhancement to the magnetic field) along a pathway 93 and then focused with quadrupole magnets 90 and directed out of the beam chamber 64 through channel 97 in the beam chamber access port 22.

Figure 3:
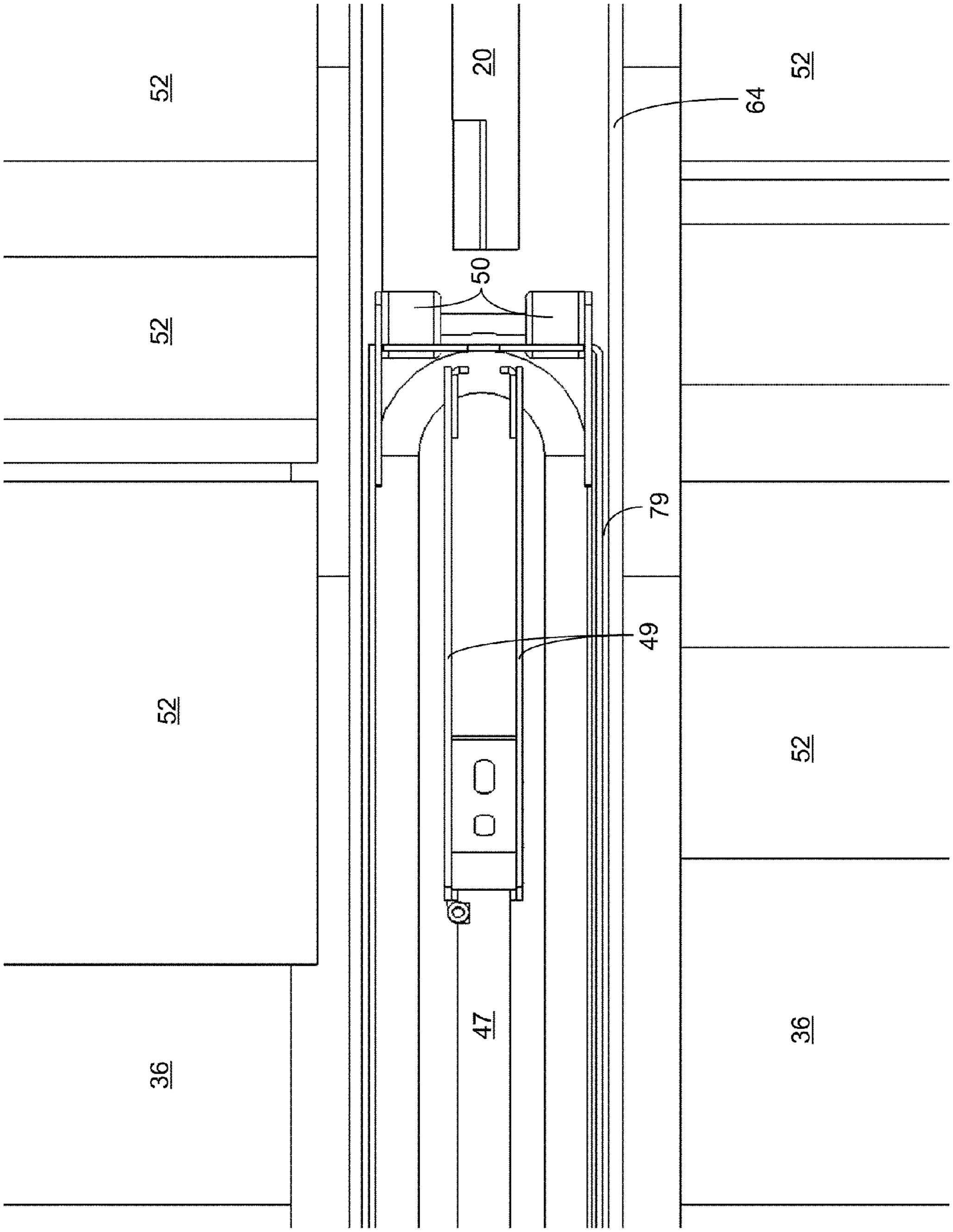
FIG. 3 is a further magnified sectional view of the electrode and beam chamber inside the isochronous cyclotron of FIG. 1.

The beam chamber 64 and the dee electrode plates 49 reside inside the above-described inner super-insulation layer that provides thermal insulation between the electrode apparatus 48, which emits heat, and the cryogenically cooled magnetic yoke 10. The electrode plates 49 can accordingly operate at a temperature at least 40K higher than the temperature of the magnetic yoke 10 and the superconducting coils 12 and 14. As shown in FIG. 3, the electrode plates 49 are contained in an outer electrical ground plate 79 (in the form, e.g., of a copper liner) inside the beam chamber 64, where the space 78 between edge of the electrode plates 49 and the edge of the electrical ground plate (as shown in FIG. 7) serves as an acceleration gap.

The acceleration-system beam chamber 64 and dee electrode plates 49 can be sized, for example, to produce a 12.5-MeV proton beam (charge=1, mass=1) at a fixed acceleration voltage, $V_0$, of, e.g., 10-80 kV. The beam chamber 64 can have a height of 42 mm and a width of 230 mm. The ferromagnetic iron poles 38 and 40 and return yoke 36 are designed as a split structure to facilitate assembly and maintenance; and the yoke has an outer radius about 2.4 times the radius, $r_p$, of the poles from the central axis to the inner radii of the coils 12 and 14 (e.g., about 24 cm, where $r_p$ is 10 cm) or less, and a total height of about $2r_p$ (e.g., about 20 cm, where $r_p$ is 10 cm).

In operation, in one embodiment, a voltage (e.g., sufficient to generate at least 700 A of current in each winding of the embodiment with 1,000 windings in the coil, described above) can be applied to each coil 12/14 via the current lead in conductive link 58 to generate a combined magnetic field from the coils 12 and 14 and yoke 10 of, for example, at least 6 Tesla at the ion source proximate the central axis in the median acceleration plane 18 when the coils are at 4.5 K. In other embodiments, a greater number of coil windings can be provided, and the current can be reduced. The magnetic field includes a contribution of, e.g., at least about 2 Tesla from the fully magnetized iron poles 38 and 40 (including the sector pole tips 52); the remainder of the magnetic field (e.g., at least about 4 Tesla) is produced by the coils 12 and 14.

Accordingly, this yoke 10 and coils 12 and 14 serve to generate a magnetic field sufficient for ion acceleration. Pulses of ions can be generated by the ion source, e.g., by applying a voltage pulse to a heated cathode to cause electrons to be discharged from the cathode into hydrogen gas; wherein, protons are emitted when the electrons collide with the hydrogen molecules. Though the beam chamber 64 is evacuated to a vacuum pressure of, e.g., less than $10^{-3}$ atmosphere, hydrogen is admitted and regulated in an amount that enables maintenance of the low pressure, while still providing a sufficient number of gas molecules for production of a sufficient number of protons.

In this embodiment, the voltage source (e.g., a high-frequency oscillating circuit) maintains an alternating or oscillating potential difference of, e.g., 10 to 80 kilo-volts across the plates 49 of the RF accelerator electrode apparatus 48. The electric field generated by the RF accelerator electrode plates 49 has a fixed frequency (e.g., 60 to 140 MHz) matching that of the cyclotron orbital frequency of the proton ion to be accelerated for a 4-9 Tesla field strength at the central axis. The electric field produced by the electrode plates 49 produces a focusing action that keeps the ions traveling approximately in the central part of the region of the interior of the plates, and the electric-field impulses provided by the electrode plates 49 to the ions cumulatively increase the speed of the emitted and orbiting ions. As the ions are thereby accelerated in their orbit, the ions spiral outward from the central axis in successive revolutions in resonance or synchronicity with the oscillations in the electric fields.

Specifically, the electrode plates 49 have a charge opposite that of the orbiting ion when the ion is away from the electrode apparatus 48 to draw the ion in its arched path toward the electrode apparatus 48 via an opposite-charge attraction. The electrode apparatus 48 is provided with a charge of the same sign as that of the ion when the ion is passing between its plates to send the ion back away in its orbit via a same-charge repulsion; and the cycle is repeated. Under the influence of the strong magnetic field at right angles to its path, the ion is directed in a spiraling path passing between the electrode plates 49. As the ion gradually spirals outward, the momentum of the ion increases proportionally to the increase in radius of its orbit, until the ion eventually reaches an outer radius 94 at which it can be magnetically deflected by a magnetic deflector system (e.g., including a perimeter magnet 89, as shown in FIGS. 18 and 19) into a collector channel defined by quadrupole magnets 90 to allow the ion to deviate outwardly from the magnetic field and to be withdrawn from the cyclotron (in the form of a pulsed beam) toward, e.g., an external target.

Isochronous cyclotrons (including those described herein) differ from synchrocyclotrons in a number of fundamental respects. First, the acceleration frequency in an isochronous cyclotron is fixed, while the acceleration frequency in a synchrocyclotron decreases as a charged particle is accelerated outward in a spiral from an inner radius, where it is introduced, to an outer radius for extraction. Second, the magnetic field inside the isochronous cyclotron increases with increasing radius to account for relativistic mass gain in the accelerated particle, while the magnetic field in a synchrocyclotron, in contrast, decreases with increasing radius. Third, the magnetic field in the acceleration plane of an isochronous cyclotron is asymmetric, as the field is azimuthally varied with sector magnets, while the magnetic field in the acceleration plane of a synchrocyclotron, in contrast, is substantially circularly symmetrical.

The average magnetic field, $B_z(r)$, can be defined as a function of radius, r, as $B_z(r)=\gamma(r)\ B_z(0)$, where $\gamma(r)$ is the relativistic factor for particle-mass gain with acceleration as a function of radius, and $B_z(0)$ is the average magnetic field at the inner radius where the ion is introduced. In other words, the magnetic field, $B_z(r)$, increases proportionately to the increase in the relativistic factor, $\gamma(r)$, at increasing radii. The relativistic factor, $\gamma$, can be calculated as follows:

$$\gamma = \frac{T + E_0}{E_0} = 1 + \frac{T}{E_0},$$

wherein T is the kinetic energy of the ion; and $E_0$ is the rest mass energy of the ion and is equal to $m_0 c^2$, where $m_0$ is the rest mass of the ion, and c is the speed of light. The rest mass energy, $E_0$, of a proton is 938.27 MeV.

The compact, cold, superconducting isochronous cyclotrons described herein, when used to produce 12.5 MeV protons, can have a relativistic factor, $\gamma_{final}$=1+12.5 MeV/938.3 MeV=1.013 at the outer radius, where the accelerated proton is extracted. With such a low relativistic factor, $\gamma$, the effect of relativity on the acceleration of the ion is relatively minor compared with previous isochronous cyclotron designs, which have had, for example, a $\gamma_{final}$ of 1.27. However the cold iron isochronous cyclotron works for high proton gammas, as well.

Figure 13:
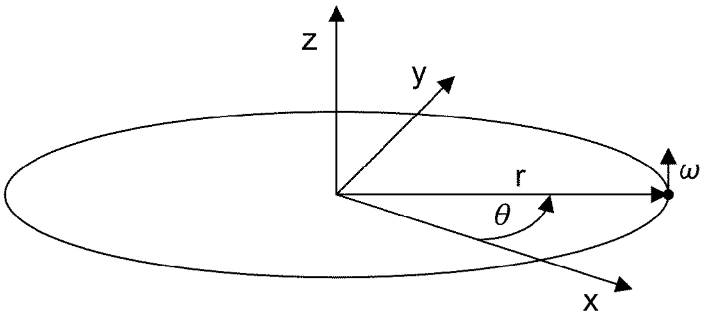
FIG. 13 is a sketch of the axial reference frame for the ion orbits inside the isochronous cyclotron.

The vertical motion of the accelerated ion (orthogonal to the median acceleration plane 18, shown in FIG. 12) in an isochronous magnetic field, $B_Z$, that increases with increasing radius (i.e., $$\left(i.e., \frac{dB}{dr} > 0\right),$$

where the field index parameter, n, can be expressed as $$n = -\frac{r}{B}\left(\frac{dB}{dr}\right) < 0,$$

and where $B=\gamma B_0$, is not inherently stable, so the weak focusing of classical and synchrocyclotrons does not apply. Accordingly, a magnetic force, $F_z$, in the z direction that varies azimuthally (i.e., where $B_Z$ varies as a function of $\theta$, see FIG. 13 for illustrative reference to the coordinate system used herein) is used to provide a restoring force in the z direction in a plurality of sectors to push the ion back to the median acceleration plane 18 and to accordingly maintain strong focusing of the accelerated ion. This azimuthally varying restoring force is provided in the isochronous cyclotron via the magnetic flutter pole tips 52, as shown in FIG. 14.

Figure 14:
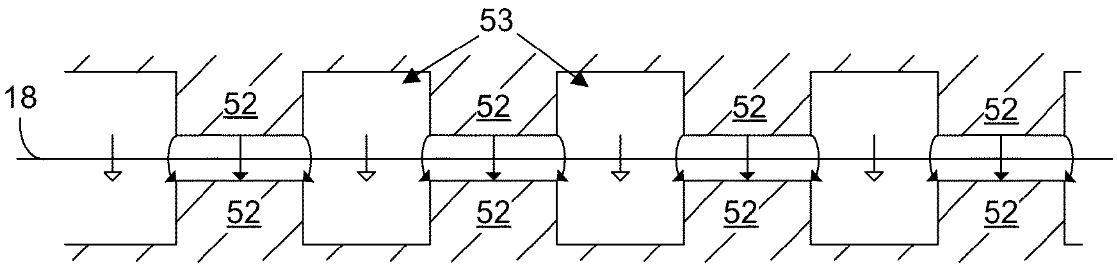
FIG. 14 is an unfurled sectional illustration of the pole sectors as "seen" by the accelerating ion in orbit inside the isochronous cyclotron.

A representation of the pole profiles across the range of angles, θ (i.e., as if the pole profile traversed by the ion in an orbit was unwrapped to produce a linear representation of a plot in the z and θ directions (at fixed radius) is provided in FIG. 14, which nearly matches the profile along the orbit traversed by the accelerated ion in one orbit inside the isochronous cyclotron). Comparatively high magnetic fields (represented with the vertical arrows) in the z direction are generated between the pole tips 52, and comparatively low fields in the z direction are generated between the valleys 53, as shown in FIG. 14.

The magnetic flutter, f, provided by the magnetic flutter pole tips 52 can be expressed as follows:

$$f = \frac{1}{2}\frac{\Delta B}{2\langle B\rangle},$$

where $\Delta B = B_{hill} - B_{valley}$, and $$\langle B\rangle = \frac{1}{2\pi}\int B_z d\theta.$$

The root mean square, F, of the flutter field can be expressed as follows:

$$F = \frac{1}{2\pi}\int d\theta \frac{[B_z(r,\theta) - \langle B_z(r,\theta)\rangle]^2}{\langle B_z(r)\rangle^2}. \tag{1}$$

When the poles have a spiral edge angle, the flutter field correction that returns the accelerated ion to axial stability is expressed in the following equation: $v_z^2 = n + F^2(1 + 2\tan^2\zeta) > 0$. In this equation, $v_z$ is the oscillation frequency of the accelerated ion in the z direction, ζ and is the angle at the spiral edge of the spiral-shaped flutter pole tip 52 as shown in FIG. 6. The tangent of the spiral edge angle, ζ, can be expressed as follows:

$$\tan^2\zeta = r\frac{d\theta}{dr} = r\left(\frac{r}{a}\right) = \frac{r^2}{a}. \tag{2}$$

Figure 15:
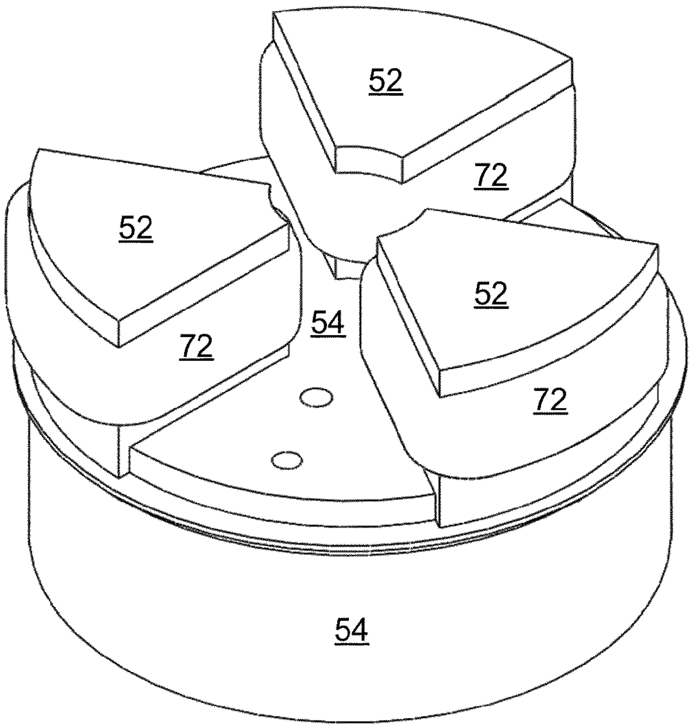
FIG. 15 is a perspective view of an alternative embodiment of pole tips the and a pole base, wherein the pole tips are wrapped with superconductor coil rings.

In other embodiments, the sector pole tips 52 can have a pie (wedge) shape, as shown in FIG. 15. The perimeter of each of these pole tips 52 is in the form of a ring 72 of superconductor coil having input and output current leads coupled with a voltage source to generate current flow through the superconductor-coil ring 72, which thereby produces a high magnetic field. The current leads to and from the superconductor-coil ring 72 of each pole tip 52 can be coupled in series to the voltage source. The interior portion of these pole tips 52 surrounded by the superconductor coil can be formed of, e.g., iron or a rare earth magnet.

In the isochronous cyclotron, $B_Z$ increases with radius as the mass of the accelerated ion increases, where $\gamma = m/m_0$, while providing sufficient flutter such that $v_z^2 > 0$, in which case, $$f = \frac{1}{2}\frac{\Delta B}{\langle B_z(r)\rangle}. \tag{3}$$

While the strong focusing provided by the spiral flutter tips hold the accelerating ion in a stable orbit in or near the median acceleration plane 18, ion acceleration in the isochronous cyclotron is achieved by matching the rate on energy gain with radius with the increase in the average magnetic field. The energy gain is precisely controlled as there is no phase stability.

To see that there is no phase stability, the fractional change in the rotational period as the ion accelerates outward to maintain phase-stable acceleration can be expressed as follows:

$$\frac{d\tau}{\tau} = \left(\frac{1}{\alpha} - \frac{1}{\gamma^2}\right)\frac{dp}{p}, \tag{4}$$

wherein α is momentum compaction (how much momentum changes as a function of radius) and p is the momentum of the ion. In this equation, $0 \le \alpha \le 1$ and $\gamma \ge 1$. When $B = \gamma B_0$, then $\alpha = \gamma^2$, and $d\tau/\tau = 0$, as $$\frac{d\tau}{\tau} = \left(\frac{1}{\gamma^2} - \frac{1}{\gamma^2}\right)\frac{dp}{p} = 0. \tag{5}$$

With no relationship between period and momentum, there is no phase stability. Here, the energy gain of the ion per turn is governed by the profile of the magnetic field generated in the median acceleration plane; and the number of turns (orbits) over which an ion will be accelerated in the isochronous cyclotron will be fixed by the design of the isochronous cyclotron. The operator can select the ion charge, q; the rest mass of the ion, $m_0$; the angular frequency, $v_0$; and the kinetic energy, T, of the ion. The instantaneous energy gain per revolution, $\Delta T_1$, per turn in the isochronous cyclotron is then fixed, where $$\Delta T_1 = gqV_e \sin\phi, \tag{6}$$

where g is the number of acceleration gaps (e.g., g is 2 for a 180° dee); q is the charge of the accelerated ion; $V_e$ is the electrode voltage; $\phi = \omega t - \theta$, where ω is the angular velocity of the ion, t is time, θ is the angular coordinate of the ion in a cyclotron. Accordingly, sin ϕ establishes the value of the sinusoidal voltage when the ions cross the acceleration gaps.

In describing embodiments of the invention, specific terminology is used for the sake of clarity. For the purpose of description, specific terms are intended to at least include technical and functional equivalents that operate in a similar manner to accomplish a similar result. Additionally, in some instances where a particular embodiment of the invention includes a plurality of system elements or method steps, those elements or steps may be replaced with a single element or step; likewise, a single element or step may be replaced with a plurality of elements or steps that serve the same purpose. Further, where parameters for various properties are specified herein for embodiments of the invention, those parameters can be adjusted up or down by $1/100^{th}$, $1/50^{th}$, $1/20^{th}$, $1/10^{th}$, $1/5^{th}$, $1/3^{rd}$, 1/2, $3/4^{th}$, etc. (or up by a factor of 2, 5, 10, etc.), or by rounded-off approximations thereof, unless otherwise specified. Moreover, while this invention has been shown and described with references to particular embodiments thereof, those skilled in the art will understand that various substitutions and alterations in form and details may be made therein without departing from the scope of the invention. Further still, other aspects, functions and advantages are also within the scope of the invention; and all embodiments of the invention need not necessarily achieve all of the advantages or possess all of the characteristics described above. Additionally, steps, elements and features discussed herein in connection with one embodiment can likewise be used in conjunction with other embodiments. The contents of references, including reference texts, journal articles, patents, patent applications, etc., cited throughout the text are hereby incorporated by reference in their entirety; and appropriate components, steps, and characterizations from these references optionally may or may not be included in embodiments of this invention. Still further, the components and steps identified in the Background section are integral to this disclosure and can be used in conjunction with or substituted for components and steps described elsewhere in the disclosure within the scope of the invention. In method claims, where stages are recited in a particular order—with or without sequenced prefacing characters added for ease of reference—the stages are not to be interpreted as being temporally limited to the order in which they are recited unless otherwise specified or implied by the terms and phrasing.

What is claimed is:

1. A compact, cold, superconducting isochronous cyclotron comprising:

at least two superconducting coils that are substantially symmetric about a central axis, wherein the coils are on opposite sides of a median acceleration plane, and wherein the coils have (a) outer surfaces remote from the central axis and (b) opposed median-acceleration-plane-facing surfaces;

a magnetic yoke having an outer radius measured from the central axis no greater than 36 cm surrounding the coils and in physical contact with the coils across the outer surface of each coil and across the median-acceleration-plane-facing surface of each coil to substantially reduce or eliminate strain on the coils due to decentering forces and without an intervening cryostat between the magnetic yoke and the coils, wherein the magnetic yoke contains at least a portion of a beam chamber, wherein the median acceleration plane extends through the beam chamber, wherein the magnetic yoke includes a plurality of sector pole tips that form hills on each side of the median acceleration plane and valleys between the hills, where the hills and valleys are positioned with a constant sector periodicity that produces an azimuthal variation in the magnetic field generated in the median acceleration plane, wherein the hills are radially separated across the median acceleration plane by a gap that is narrower than a gap that separates the valleys across the median acceleration plane, wherein the superconducting coils and the physically coupled magnetic yoke are configured to generate a radially increasing magnetic field that is at least 6 Tesla at an inner radius for ion introduction and that is at least 7 Tesla at an outer radius for ion extraction in the median acceleration plane when the superconducting coils and the magnetic yoke are cooled to a temperature no greater than 50K and when electric current is passed through the superconducting coils at the coils' critical current capacity, and wherein the azimuthal variation in the magnetic field produced by the hills and valleys provides a restoring force orthogonal to the median acceleration plane to counter an inherent instability of an ion accelerated by the radially increasing magnetic field;

a cryogenic refrigerator physically and thermally coupled with the superconducting coils and with the magnetic yoke; and a cryostat mounted outside the magnetic yoke and containing the coils and the magnetic yoke inside a thermally insulated volume in which the coils and the magnetic yoke can be maintained at cryogenic temperatures by the cryogenic refrigerator.

2. The isochronous cyclotron of claim 1, wherein the magnetic yoke comprises a pair of poles on opposite sides of the median acceleration plane, each of the poles including a pole base and the sector pole tips mounted on the pole base.

3. The isochronous cyclotron of claim 1, wherein the superconducting coils are physically supported by the magnetic yoke.

4. The isochronous cyclotron of claim 1, wherein each of the sector pole tips has a spiral configuration.

5. The isochronous cyclotron of claim 4, wherein the sector pole tips comprise a rare earth ferromagnetic material.

6. The isochronous cyclotron of claim 5, wherein the magnetic yoke further includes a non-magnetic material that separates the sector pole tips from the rest of the magnetic yoke, wherein the non-magnetic material and the sector pole tips are integrally connected with the rest of the magnetic yoke.

7. The isochronous cyclotron of claim 6, wherein the sector pole tips include cut-outs on a side of the sector pole tips remote from the median acceleration plane, wherein the cut-outs are structured to increase the magnitude of gain in magnetic field with increasing radius from the central axis of the isochronous cyclotron.

8. The isochronous cyclotron of claim 1, wherein the sector pole tips comprise a material that is superconducting at a temperature of at least 4 K.

9. The isochronous cyclotron of claim 1, wherein the superconducting coils comprise a material that is superconducting at a temperature of at least 4 K.

10. A method for ion acceleration comprising:

employing an isochronous cyclotron comprising:

a) at least two superconducting coils that are substantially symmetric about a central axis, wherein the coils are on opposite sides of a median acceleration plane, and wherein the coils have (a) outer surfaces remote from the central axis and (b) opposed median-acceleration-plane-facing surfaces;

b) a magnetic yoke having an outer radius measured from the central axis that is no greater than 36 cm surrounding the coils and in physical contact with the coils across the outer surface of each coil and across the median-acceleration-plane-facing surface of each coil to substantially reduce or eliminate strain on the coils due to decentering forces and without an intervening cryostat between the magnetic yoke and the coils, wherein the magnetic yoke contains at least a portion of a beam chamber, wherein the median acceleration plane extends through the beam chamber, wherein the magnetic yoke includes a plurality of sector pole tips that form hills on each side of the median acceleration plane and valleys between the hills, where the hills and valleys are positioned within a constant sector periodicity that produces an azimuthal veriation in the magnetic field generated in the median acceleration plane, and wherein the hills are radially separated across the median acceleration plane by a gap that is narrower than a gap that separates the valleys across the median acceleration plane;

c) a cryogenic refrigerator physically and thermally coupled with the superconducting coils and with the magnetic yoke;

d) an electrode coupled with a radiofrequency voltage source and mounted in the beam chamber; and f) a cryostat mounted outside the magnetic yoke and containing the coils and the magnetic yoke;

introducing an ion into the median acceleration plane at an inner radius;

providing electric current from the radiofrequency voltage source to the electrode to accelerate the ion at a fixed frequency in an expanding orbit across the median acceleration plane;

cooling the superconducting coils and the magnetic yoke with the cryogenic refrigerator, wherein the superconducting coils are cooled to a temperature no greater than their superconducting transition temperature, and wherein the magnetic yoke is cooled to a temperature no greater than 100 K;

providing a voltage to the cooled superconducting coils to generate a superconducting current in the superconducting coils that produces a radially increasing magnetic field that is at least 6 Tesla at the inner radius where the ion is introduced and that is at least 7 Tesla at an outer radius for ion extraction in the median acceleration plane from the superconducting coils and from the yoke, wherein the azimuthal variation in the magnetic field produced by the hills and valleys provides a restoring force orthogonal to the median acceleration plane that counters an inherent instability in the accelerated ion due to the radial increase in the magnetic field; and extracting the accelerated ion from beam chamber at the outer radius.

11. The method of claim 10, wherein the magnetic yoke is cooled to a temperature no greater than 50K.

12. The method of claim 10, wherein the magnetic field produced in the median acceleration plane increases with radius from the inner radius for ion introduction to the outer radius for ion extraction.

13. The method of claim 12, wherein the magnetic field produced in the median acceleration plane is at least 6 Tesla at the inner radius for ion introduction.

14. The method of claim 10, wherein the ion is accelerated at a fixed frequency from the inner radius for ion introduction to the outer radius for ion extraction.

15. The method of claim 10, wherein the ion is a proton.

16. The method of claim 10, wherein the beam chamber has a temperature in a range of about 10° C. to about 30° C. as the ion is accelerated.

17. A compact, cold, superconducting isochronous cyclotron comprising:

at least two superconducting coils that are substantially symmetric about a central axis, wherein the coils are on opposite sides of a median acceleration plane, and wherein the coils have (a) outer surfaces remote from the central axis and (b) opposed median-acceleration-plane-facing surfaces;

a magnetic yoke having an outer radius measured from the central axis that is no greater than 36 cm surrounding the coils and in physical contact with the coils across the outer surface of each coil and across the median-acceleration-plane-facing surface of each coil to substantially reduce or eliminate strain on the coils due to decentering forces and without an intervening cryostat between the magnetic yoke and the coils, wherein the magnetic yoke contains a beam chamber, wherein the median acceleration plane extends through the beam chamber, wherein the magnetic yoke includes a plurality of sector tips that are separated from the rest of the of the magnetic yoke by non-magnetic material and that form hills on each side of the median acceleration plane and valleys between the hills, where the hills and valleys are positioned with a constant sector periodicity that produces an azimuthal variation in the magnetic field generated in the median acceleration plane, wherein the hills are radially separated across the median acceleration plane by a gap that is narrower than a gap that separates the valleys across the median acceleration plane, and wherein the superconducting coils and the physically coupled magnetic yoke are configured to generate a radially increasing magnetic field that is at least 6 Tesla at an inner radius for ion introduction and that is at least 7 Tesla at an outer radius for ion extraction when the superconducting coils and the magnetic yoke are cooled to a temperature no greater than 50K and when electric current is passed through the superconducting coils at the coils' critical current capacity, and wherein the azimuthal variation in the magnetic field produced by the hills and valleys provides a restoring force orthogonal to the median acceleration plane to counter an inherent instability of an ion accelerated by the radially increasing magnetic field;

a cryogenic refrigerator physically and thermally coupled with the superconducting coils and with the magnetic yoke; and a cryostat mounted outside the magnetic yoke and containing the coils and the magnetic yoke inside a thermally insulated volume in which the coils and the magnetic yoke can be maintained at cryogenic temperatures by the cryogenic refrigerator.

18. The isochronous cyclotron of claim 17, wherein the sector tips comprise a rare earth magnet.

19. The isochronous cyclotron of claim 17, wherein each of the sector tips has a spiral configuration.

20. The isochronous cyclotron of claim 17, wherein each of the sector tips has a surface remote from the median acceleration plane that defines a cut-out volume.

21. The isochronous cyclotron of claim 17, wherein the sector tips comprise a material that is superconducting at a temperature of at least 4 K.

* * * * *